(12) United States Patent
Nakatsukasa et al.

(10) Patent No.: US 9,754,354 B2
(45) Date of Patent: Sep. 5, 2017

(54) DISPLAY CONTROL METHOD, NON-TEMPORARY RECORDING MEDIUM STORING DISPLAY CONTROL PROGRAM, AND INFORMATION PROCESSING TERMINAL

(71) Applicant: Panasonic Intellectual Property Corporation of America, Torrance, CA (US)

(72) Inventors: Kunio Nakatsukasa, Kyoto (JP); Hiroko Sugimoto, Kyoto (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 238 days.

(21) Appl. No.: 14/643,047

(22) Filed: Mar. 10, 2015

(65) Prior Publication Data
US 2015/0279000 A1  Oct. 1, 2015

(30) Foreign Application Priority Data

Mar. 27, 2014  (JP) ................... 2014-065005
Dec. 22, 2014  (JP) ................... 2014-258815

(51) Int. Cl.
*G06T 3/60* (2006.01)
*G06T 17/05* (2011.01)
*G06F 17/50* (2006.01)
*G06T 15/20* (2011.01)

(52) U.S. Cl.
CPC ............ *G06T 3/60* (2013.01); *G06F 17/50* (2013.01); *G06T 15/20* (2013.01); *G06T 17/05* (2013.01)

(58) Field of Classification Search
CPC .......... G06F 17/30241; G06F 17/5072; G06T 17/05; G06T 11/206; G06T 2210/04
See application file for complete search history.

(56) References Cited

U.S. PATENT DOCUMENTS

| 8,490,025 B2 * | 7/2013 | Jakobson ........... G01C 21/3682 715/712 |
| 2006/0293847 A1 * | 12/2006 | Marriott ................ G01C 21/32 701/455 |
| 2011/0213593 A1 * | 9/2011 | Wilson ................ G06F 17/5004 703/1 |
| 2013/0002857 A1 * | 1/2013 | Kulik ..................... G01C 17/38 348/135 |

FOREIGN PATENT DOCUMENTS

| JP | 2000-098883 | 4/2000 |
| JP | 2003-052093 | 2/2003 |

* cited by examiner

*Primary Examiner* — Jeffrey Chow
(74) *Attorney, Agent, or Firm* — Greenblum & Bernstein, P.L.C.

(57) ABSTRACT

An information processing terminal displays a layout drawing that indicates a layout of targets on a display screen on a display unit. The information processing terminal includes a calculator that calculates an angle formed by one edge of borderlines in the layout drawing and one edge of the display screen and also has a display controller that rotates the layout drawing through the calculated angle so that the one edge of the borderlines in the layout drawing is made parallel to the one edge of the display screen and displays the rotated layout drawing on the display unit.

16 Claims, 27 Drawing Sheets

DISPLAY CONTROL METHOD, NON-TEMPORARY RECORDING MEDIUM STORING DISPLAY CONTROL PROGRAM, AND INFORMATION PROCESSING TERMINAL

BACKGROUND

1. Technical Field

The present disclosure relates to a display control method of displaying, on a display screen on a display unit, a layout drawing that represents the layout of targets, a non-temporary recording medium that stores a display control program, and an information processing terminal.

2. Description of the Related Art

As network technologies have progressed and devices have had more advanced functions, there has been an increasing need for a so-called home network system that enables linkage control or remote control of a plurality of devices connected to a network. The concept itself of the home network system has been widely known. Although its various technologies have been developed, particular attention is paid to usability of the home network system in recent years. Specifically, it is necessary to provide user interfaces through which the user can easily handle a home network system even in a case in which many devices each of which performs advanced processing are connected to a network.

In a general home network system, the user uses a controller that controls a plurality of devices in an integrated manner (the controller will be referred to below as the home controller). Various forms are possible for user interfaces of this home controller, in one of which the floor plan of a building is displayed on a display unit; when the user touches or clicks the icon of a device indicated on the floor plan, the device is specified as the device to be manipulated (see Japanese Unexamined Patent Application Publication No. 2003-52093, for example).

In this method, while checking the positions of devices in a home on a two-dimensional drawing, the user can specify a device to be manipulated.

SUMMARY

In the conventional method, however, the floor plan is always displayed in the same direction regardless of the direction in which the user is facing, so in an environment in which there are a plurality of device of the same type in a home, there has been the problem that the user cannot smoothly specify a device to be manipulated.

Thus, a non-limiting exemplary embodiment of the present disclosure provides a display control method, a display control program, and an information processing terminal that can improve visibility to the user.

In one general aspect, the techniques disclosed here feature that the display control method displays a layout drawing that indicates the layout of targets on a display screen on a display unit included in an information processing terminal; the method includes a calculation step of calculating an angle formed by one edge of borderlines in the layout drawing and one edge of the display screen and a display control step of rotating the layout drawing through the angle calculated in the calculation step so that the one edge of the borderlines in the layout drawing is made parallel to the one edge of the display screen and displaying, on the display unit, the layout drawing that has been rotated.

These general and specific aspects may be implemented using a system, a method, and a computer program, and any combination of systems, methods, and computer programs.

According to the present disclosure, it is possible to prevent a layout drawing to be displayed at an angle with respect to the display screen and also prevent the displayed layout drawing to be frequently rotated, so visibility to the user can be improved.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

Figure 1:
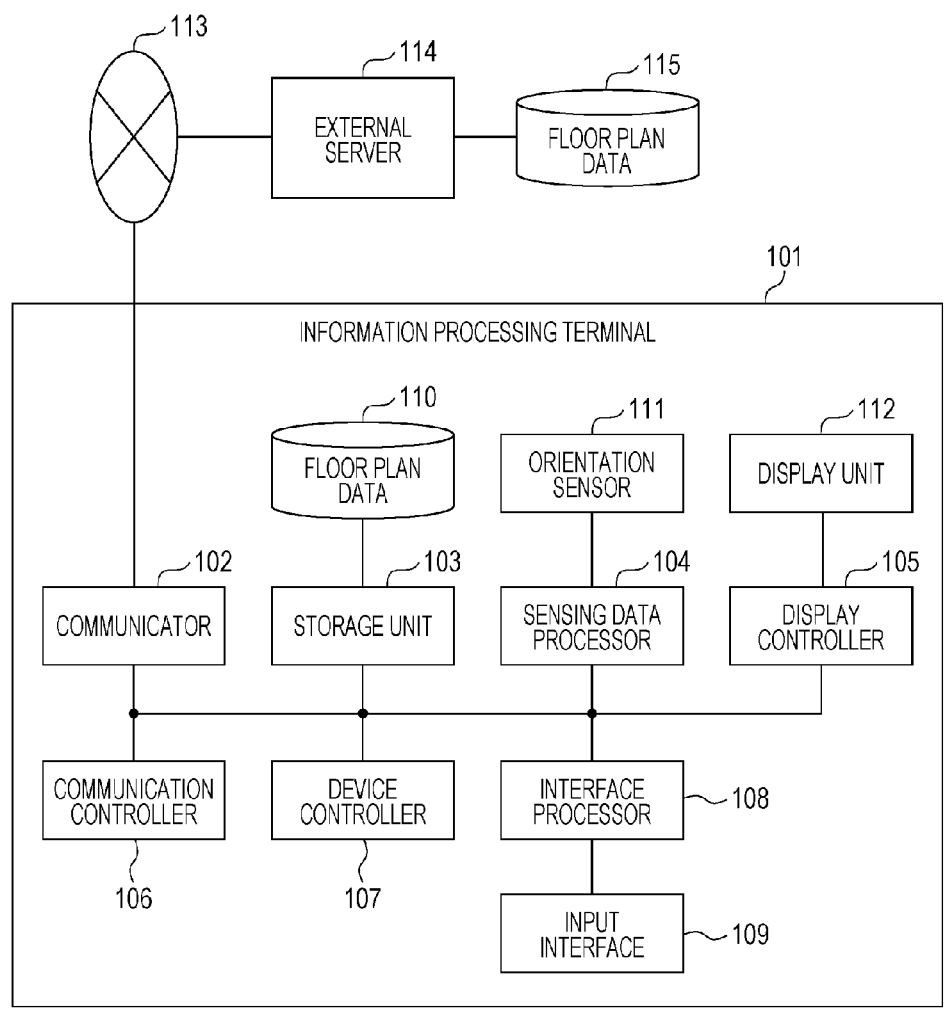
FIG. 1 illustrates an aspect of the structure of a display control system in a first embodiment of the present disclosure.

DETAILED DESCRIPTION (Underlying Knowledge Forming Basis of the Present Disclosure)

If a floor plan is always displayed in the same direction on a screen of a home controller as described above, the on-screen positions of units may largely differ from the actual unit positions viewed by the user and the user may not intuitively specify a device to be manipulated. A possible solution to this problem is to apply heading-up display or north-up display to a map, as having been carried out in car navigation systems or the like. In heading-up display, a map is displayed so that the upward direction of the display screen always matches the direction in which the user travels. In north-up display, a map is displayed so that the upward direction of the display screen always matches the north direction.

When a map is displayed, it suffices to uniformly display the periphery of a certain point. However, a floor plan is usually an area enclosed with the exterior walls of a building, so the shape of an area to be displayed on a screen is always the same and is finite. Therefore, if heading-up display is simply used to display a floor plan in the same way as for a map, the floor plan may not fit to the screen frame or a displayed floor plan may deviate from the screen frame. This impairs the design of user interfaces and loses their consistency. As a result, the usability of the system is greatly lowered.

When the terminal is oriented toward the south, north-up display makes it difficult for the user to intuitively grasp a positional relationship. Another problem with heading-up display is that when the user travels while holding the terminal, the orientation of the displayed floor plan is frequently changed.

The present disclosure obtained an idea according to the above underlying knowledge.

A display control method in an aspect of the present disclosure is a display control method of displaying a layout drawing that indicates the layout of targets on a display screen on a display unit included in an information processing terminal; the method includes a calculation step of calculating an angle formed by one edge of borderlines in the layout drawing and one edge of the display screen, and also includes a display control step of rotating the layout drawing through the angle calculated in the calculation step so that the one edge of the borderlines in the layout drawing is made parallel to the one edge of the display screen and displaying, on the display unit, the layout drawing that has been rotated.

In this structure, an angle formed by one edge of borderlines in a layout drawing and one edge of a display screen is calculated. Then, the layout drawing is rotated through the calculated angle so that the one edge of the borderlines in the layout drawing is made parallel to the one edge of the display screen and the layout drawing that has been rotated is displayed on a display unit.

Therefore, it is possible to prevent a layout drawing to be displayed at an angle with respect to the display screen and also prevent the displayed layout drawing to be frequently rotated, so visibility to the user can be improved.

The above display control method may further include an orientation detecting step of detecting the orientation of the top of the information processing terminal. In the display control step, the layout drawing may be rotated according to the orientation detected in the orientation detecting step.

In this structure, a layout drawing is rotated according to the orientation of the top of the information processing terminal, so a decision as to whether to rotate the layout drawing can be made according to the orientation of the top of the information processing terminal. Therefore, it is possible to prevent the layout drawing from being unintentionally rotated.

The display control method described above may further include a position detecting step of detecting the position of the information processing terminal, the position being on a map. In the display control step, a decision as to whether to rotate the layout drawing may be made according to the position detected in the position detecting step.

In this structure, a decision as to whether to rotate a layout drawing can be made according to the position of the information processing terminal. Therefore, it is possible to prevent the layout drawing from being unintentionally rotated.

In the display control step in the display control method described above, the position, of the information processing terminal, that has been detected in the position detecting step may be compared with the position of a facility corresponding to the layout drawing, the position being on the map, to decide whether the information processing terminal is present in the facility. If it is decided that the information processing terminal is not present in the facility, the layout drawing may not be rotated.

In this structure, the detected position of the information processing terminal is compared with the position of a facility corresponding to the layout drawing, the position being on the map, to decide whether the information processing terminal is present in the facility. If it is decided that the information processing terminal is not present in the facility, the layout drawing is not rotated.

Therefore, since the layout drawing is not rotated if the information processing terminal is not present in the facility, it is possible to prevent the layout drawing from being unintentionally rotated when the user is outside the facility. This can improve usability to the user.

The display control method described above may further include a broadcasting step of broadcasting a prescribed wireless signal to the periphery of the information processing terminal, and may also include a reception step of receiving a reply signal transmitted from a device in the periphery of the information processing terminal in response to the wireless signal broadcasted in the transmission step. In the display control step, a decision as to whether to rotate the layout drawing may be made according to the reply signal received in the reception step.

In this structure, a prescribed wireless signal is broadcasted to the periphery of the information processing terminal and a reply signal is received from a device in the periphery of the information processing terminal in response to the broadcasted wireless signal. Then, whether to rotate the layout drawing is decided according to the received reply signal.

Therefore, since a decision as to whether to rotate the layout drawing is made according to the reply signal from the device in the periphery of the information processing terminal, it is possible to decide whether to rotate the layout drawing according to a reception situation of the received reply signal and thereby to prevent the layout drawing from being unintentionally rotated.

In the display control step in the display control method described above, a decision may be made as to whether the information processing terminal is present in a prescribed area included in the layout drawing according to at least one of information, included in the reply signal, that indicates the device that has transmitted the reply signal, the radio wave intensity of the reply signal, and a travel time from when the wireless signal is broadcasted until the reply signal is received. If it is decided that the information processing terminal is not present in the prescribed area, the layout drawing may not be rotated.

In this structure, a decision is made as to whether the information processing terminal is present in a prescribed area included in the layout drawing according to at least one of information, included in the reply signal, that indicates the device that has transmitted the reply signal, the radio wave intensity of the reply signal, and a travel time from when the wireless signal is broadcasted until the reply signal is received. If it is decided that the information processing terminal is not present in the prescribed area, the layout drawing is not rotated.

Therefore, if it is decided that the information processing terminal is not present in the prescribed area included in the layout drawing, the layout drawing is not rotated, so it is possible to prevent the layout drawing from being unintentionally rotated when the user is present in other than the prescribed area. This can improve usability to the user.

In the calculation step in the display control method described above, the layout drawing may be rotated so that the orientation of the one edge of the borderlines matches any one of the north, south, east and west directions on a map, and an angle formed by the one edge of the borderlines in the layout drawing that has been rotated and the one edge of the display screen may be calculated.

In this structure, a layout drawing is rotated so that the orientation of one edge of the borderlines in the layout drawing matches any one of the north, south, east and west directions on a map and an angle is calculated by using the layout drawing that has been rotated. Therefore, it is possible to easily calculate an angle by using the layout drawing that has been rotated according to the matched orientation.

The above display control method may further include an orientation setting step of setting the orientation of the one edge of the borderlines according to a user's manipulation. In the orientation setting step, a layout drawing that can be moved, magnified, contracted, or rotated on the display screen and a peripheral map that can be moved, magnified, contracted, or rotated on the display screen, the peripheral map indicating the periphery of the layout drawing, may be displayed on the display unit, and if the layout drawing and peripheral map overlap on the display screen as a result of a user's manipulation, the orientation of layout drawing may be set by using orientation information included in the peripheral map.

In this structure, the orientation of one edge of the borderlines is set according to a user's manipulation. A layout drawing that can be moved, magnified, contracted, or rotated on the display screen and a peripheral map that can be moved, magnified, contracted, or rotated on the display screen, the peripheral map indicating the periphery of the layout drawing, are displayed on the display unit, and if the layout drawing and peripheral map overlap on the display screen as a result of a user's manipulation, orientation information about the layout drawing is set by using orientation information included in the peripheral map.

Therefore, even if orientation information about the layout drawing has not been set, it can be set by using orientation information included in a peripheral map that indicates a map around the layout drawing.

In the display control method described above, the layout drawing may include a floor plan that indicates a layout in a building and the one edge of the borderlines, which is parallel to the one edge of the display screen, may be a borderline that indicates an exterior wall of the building.

In this structure, a floor plan that indicates a layout in a building can be displayed.

In the display control method described above, the layout drawing may include a floor plan that indicates a layout in a building and the one edge of the borderlines, which is parallel to the one edge of the display screen, may be a borderline that indicates a wall of a room in the building.

In this structure, a floor plan that indicates a layout in a building can be displayed and the layout drawing can be rotated so that one edge of the borderlines that indicate the walls of a room in a building is made parallel to one edge of the display screen.

In the display control method described above, the layout drawing may include a floor plan that indicates a layout in a building. The above display control method may further include a borderline creating step of creating a virtual borderline that indicates a virtual wall for a borderline that indicates an exterior wall of the building or for a borderline that indicates a wall of a room in the building. The one edge of the borderlines, which is parallel to the one edge of the display screen, may include the virtual borderline created in the borderline creating step.

In this structure, a layout drawing includes a floor plan that indicates a layout in a building. A virtual borderline that indicates a virtual wall is created for a borderline that indicates an exterior wall of the building or for a borderline that indicates a wall of a room in the building. One edge of the borderlines, which is parallel to one edge of the display screen, includes the created virtual borderline.

Therefore, since a virtual borderline that indicates a virtual wall is created for a borderline that indicates an exterior wall of the building or for a borderline that indicates a wall of a room in the building and an angle is calculated by using the created virtual borderline, when the shape of the floor plan is corrected to a rectangular shape, it is possible to prevent the displayed floor plan from being frequently rotated.

In the virtual borderline creating step in the display control method described above, the virtual borderline may be created so that the exterior walls or the walls that enclose the room form a convex polygonal shape.

In this structure, since the virtual borderline is created so that the exterior walls or the walls enclosing a room form a convex polygonal shape, it is possible to prevent the displayed floor plan from being frequently rotated.

In the virtual borderline creating step in the display control method described above, the virtual borderline may be created so that the number of edges of the borderlines that indicate the exterior walls or of the borderlines that indicate the walls of the room is reduced by extending the borderline that indicates an exterior wall or the borderline that indicates a wall of the room.

In this structure, since a virtual borderline is created so that the number of edges of the borderlines that indicate the exterior walls or of the borderlines that indicate the walls of a room is reduced by extending a borderline that indicates an exterior wall or a borderline that indicates a wall of the room, it is possible to prevent the displayed floor plan from being frequently rotated.

The above display control method may further include a borderline editing step of accepting deletion of the virtual borderline created in the borderline creating step or addition of a new virtual borderline according to a user's manipulation. In the borderline editing step, if the borderlines are not closed in the floor plan as a result of the deletion of the borderline or the addition of the new virtual borderline, the user may be notified.

In this structure, deletion of a created virtual borderline or addition of a new virtual borderline is accepted according to a user's manipulation. If the borderlines are not closed in the floor plan as a result of the deletion of the borderline or the addition of the new virtual borderline, the user is notified.

Therefore, since deletion of a created virtual borderline or addition of a new virtual borderline is accepted according to a user's manipulation, it is possible to correct the shape of the floor plan to a shape desired by the user and to prevent the displayed floor plan from being frequently rotated. If the borderlines are not closed in the floor plan, the user is notified, so the shape of the floor plan can be reliably corrected.

A non-temporary recording medium in another aspect of the present disclosure is a non-temporary recording medium in which a display control program is recorded, the display control program displaying a layout drawing that indicates the layout of targets on a display screen on a display unit included in an information processing terminal; the display control program causes a computer in the information processing terminal to calculate an angle formed by one edge of borderlines in the layout drawing and one edge of the display screen and to rotate the layout drawing through the angle calculated so that the one edge of the borderlines in the layout drawing is made parallel to the one edge of the display screen, and to display, on the display unit, the layout drawing that has been rotated.

In this structure, an angle formed by one edge of borderlines in a layout drawing and one edge of a display screen is calculated, the layout drawing is rotated through the calculated angle so that the one edge of the borderlines in the layout drawing is made parallel to the one edge of the display screen, and the layout drawing that has been rotated is displayed on the display unit.

Therefore, it is possible to prevent the layout drawing to be displayed at an angle with respect to the display screen and also prevent the displayed layout drawing to be frequently rotated, so visibility to the user can be improved.

An information processing terminal in another aspect of the present disclosure is an information processing terminal that displays a layout drawing that indicates the layout of targets on a display screen. The information processing terminal includes a display unit, a calculator that calculates an angle formed by one edge of borderlines in the layout drawing and one edge of the display screen and a display controller that rotates the layout drawing through the angle calculated by the calculator so that the one edge of the borderlines in the layout drawing is made parallel to the one edge of the display screen and displays, on the display unit, the layout drawing that has been rotated.

In this structure, an angle formed by one edge of borderlines in a layout drawing and one edge of a display screen is calculated, the layout drawing is rotated through the calculated angle so that the one edge of the borderlines in the layout drawing is made parallel to the one edge of the display screen, and the layout drawing that has been rotated is displayed on the display unit.

Therefore, it is possible to prevent the layout drawing to be displayed at an angle with respect to the display screen and also prevent the displayed layout drawing to be frequently rotated, so visibility to the user can be improved.

Embodiments of the present disclosure will be described below with reference to the drawings. The embodiments described below are only specific examples of the present disclosure and do not restrict the technical range of the present disclosure.

First Embodiment

FIG. 1 illustrates an aspect of the structure of a display control system in a first embodiment of the present disclosure. The display control system includes an information processing terminal 101 and an external server 114.

The information processing terminal 101 in FIG. 1 is used as a controller that controls devices in a home network system (the controller will be referred to below as the home controller). The information processing terminal 101 is, for example, a mobile telephone, a smartphone, a tablet terminal, or another generally available mobile device. That is, the information processing terminal 101 includes a processor, a volatile memory, and an auxiliary storage unit (which are not illustrated). Various means that implement a display control method, which will be described later, are implemented by loading programs stored in the auxiliary storage unit into the volatile memory and causing the processor to execute the programs.

As illustrated in FIG. 1, the information processing terminal 101 includes a communicator 102, a storage unit 103, a sensing data processor 104, a display controller 105, a communication controller 106, a device controller 107, an interface processor 108, an input interface 109, an orientation sensor 111, and a display unit 112.

The display unit 112, which is formed with, for example, a liquid crystal display unit, displays various information items. The display controller 105 controls what is displayed on the display unit 112. The orientation sensor 111 detects the orientation of the top of the information processing terminal 101. The sensing data processor 104 processes a value detected by the orientation sensor 111. The storage unit 103 stores electronic data 110 of a building's floor plan displayed on a manipulation screen on the display unit 112 (the electronic data will be referred to below as the floor plan data).

The floor plan data 110 may be installed from an arbitrary external storage unit and may be stored in the storage unit 103. Alternatively, as the floor plan data 110, floor plan data 115 stored in the external server 114 may be downloaded by the communicator 102 through the Internet 113, and may then be stored in the storage unit 103.

The display controller 105 calculates an angle formed by one edge of borderlines in the layout drawing, which indicates the layout of targets, and one edge of a display screen on the display unit 112. The layout drawing may be a floor plan in a building. One edge of the borderlines that is parallel to one edge of the display screen is a borderline that indicates an exterior wall of a building. Alternatively, the one edge of the borderlines that is parallel to the one edge of the display screen may be a borderline that indicates a wall of a room in the building.

The shape of the display unit 112 is, for example, rectangular. The display controller 105 rotates the layout drawing (floor plan) through the calculated angle so that the one edge of the borderlines in the layout drawing is made parallel to the one edge of the display screen, and displays, on the display unit 112, the layout drawing (floor plan). The display controller 105 rotates the layout drawing (floor plan) so that the orientation of the one edge of the borderlines matches any one of the north, south, east and west directions on a map, and calculates an angle formed by the one edge of the borderlines in the layout drawing that has been rotated and the one edge of the display screen.

The orientation sensor 111 detects the orientation of the top of the information processing terminal 101. The display controller 105 rotates the layout drawing (floor plan) according to the orientation detected by the orientation sensor 111.

If orientation information is not included in the layout drawing (floor plan), the display controller 105 can also set the orientation of one edge of the borderlines in the layout drawing (floor plan) according to a user's manipulation. The display controller 105 displays, on the display unit 112, a layout drawing (floor plan) that can be moved, magnified, contracted, or rotated and a peripheral map that can be moved, magnified, contracted, or rotated on the display screen, the peripheral map indicating the periphery of the layout drawing (floor plan). If the layout drawing (floor plan) and peripheral map overlap on the display screen as a result of a user's manipulation, the display controller 105 sets orientation information about the layout drawing (floor plan) by using orientation information included in the peripheral map.

The communicator 102, communication controller 106, and device controller 107 in FIG. 1 are used to implement wireless communication and device control carried bout by a mobile telephone, a smartphone, a tablet terminal, or another generally available mobile device, and are not constituent element specific to the present disclosure, so their detailed descriptions will be omitted. For convenience of the following descriptions, touch-panel input interfaces are used as examples of the input interface 109 and interface processor 108, but this does not restrict the embodiments of the present disclosure. These interfaces may be changed to interfaces in various forms that accept inputs by buttons, inputs from a mouse or a keyboard, voice inputs, and the like.

Next, an entire flow in the display control method in the first embodiment of the present disclosure will be described with reference to the flowchart in FIG. 2.

Figure 2:
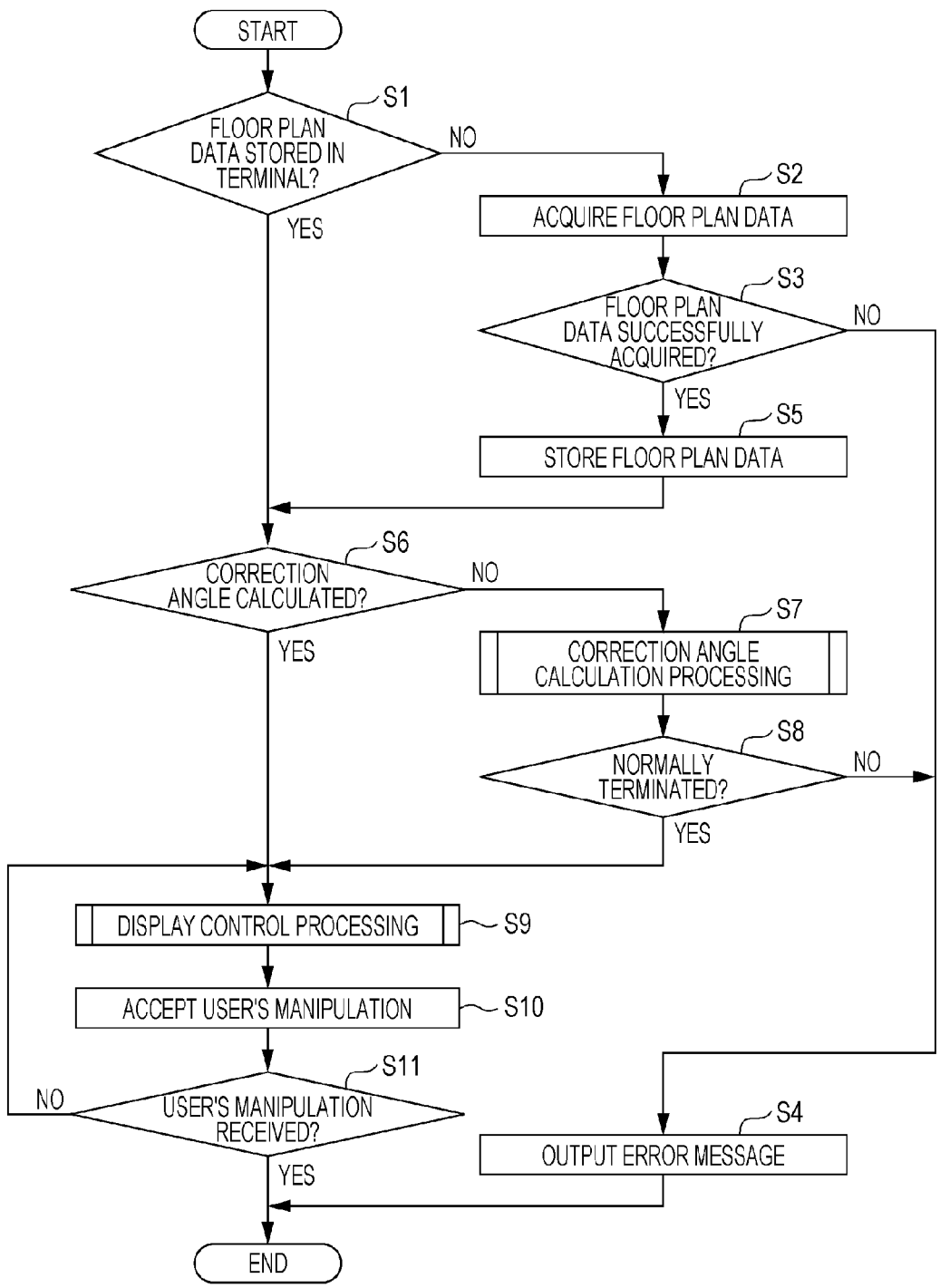
FIG. 2 is a flowchart illustrating an entire flow in a display control method in the first embodiment of the present disclosure.

FIG. 2 is a flowchart illustrating an entire flow in the display control method in the first embodiment of the present disclosure.

To start a procedure for remotely manipulating a device, the user manipulates the information processing terminal 101. First, the display controller 105 decides whether the floor plan data 110 is stored in the information processing terminal 101 (step S1). In this embodiment, the floor plan data 110 includes not only data that indicates a floor plan itself of a building but also the orientation of the floor plan on a map and positional data about devices associated with individual rooms in the floor plan. The user can remotely manipulate a device by, for example, selecting its relevant device icon displayed in the floor plan.

If the display controller 105 decides that the floor plan data 110 is not stored in the information processing terminal 101 (the result in step S1 is No), the display controller 105 acquires the floor plan data 115 stored in the external server 114 through the Internet 113 (step S2). Specifically, the communicator 102 transmits a request signal that request the floor plan data 115 to the external server 114. Upon receipt of the request signal from the information processing terminal 101, the external server 114 reads out the floor plan data 115 and transmits it to the information processing terminal 101. The communicator 102 receives the floor plan data 115 transmitted from the external server 114 and outputs the floor plan data 115 to the display controller 105.

Next, the display controller 105 decides whether the floor plan data 115 has been successfully acquired (step S3). If the display controller 105 decides that the floor plan data 115 has failed to be acquired (the result in step S3 is No), the display controller 105 outputs (displays) an error message to the display unit 112, and terminates the sequence (step S4). If there is no desired floor plan data 115 in the external server 114 or no floor plan data 115 can be received from the external server 114 for some reason, it is decided that the floor plan data 115 has failed to be received.

If the display controller 105 decides that the floor plan data 115 has been successfully acquired (the result in step S3 is Yes), the display controller 105 stores the acquired floor plan data 115 in the storage unit 103 as the floor plan data 110 (step S5).

If the display controller 105 decides that the floor plan data 110 is stored in the information processing terminal 101 (the result in step S1 is Yes) or the floor plan data 115 acquired from the external server 114 is stored in the storage unit 103, the display controller 105 decides whether a correction angle according to which at least one edge of the wall surfaces in the floor plan included in the floor plan data 110 stored in the storage unit 103 is made parallel to at least one edge of the display screen on the display unit 112 has been calculated (step S6).

If the display controller 105 decides that a correction angle has not been calculated (the result in step S6 is No), the display controller 105 calculates a correction angle according to which the floor plan data 110 or 115, whichever is applicable, is corrected in correction angle calculation processing described later (step S7).

Next, the display controller 105 decides whether the correction angle calculation processing has been normally terminated (step S8). If the display controller 105 decides that the correction angle calculation processing has not been normally terminated (the result in step S8 is No), the display controller 105 outputs (displays) an error message, and terminates the sequence (step S4).

If the display controller 105 decides that the correction angle calculation processing has been normally terminated (the result in step S8 is Yes) or that a correction angle has been calculated (the result in step S6 is Yes), the display controller 105 updates the display of the floor plan on the display screen in display control processing described later (step S9).

Next, the display controller 105 accepts a user's manipulation for the displayed floor plan (step S10).

The display controller 105 then decides whether the user's manipulation has been received (step S11). If the display controller 105 decides that the user's manipulation has been received (the result in step S11 is Yes), the display controller 105 performs processing corresponding to the received user's manipulation and terminates the sequence. If the display controller 105 decides that the user's manipulation has not been received (the result in step S11 is No), the display controller 105 returns to step S9 and repeats the processing in steps S9 to S11 until a user's manipulation is received.

Next, the flow of the correction angle calculation processing in step S7 in FIG. 2 will be described in detail with reference to FIGS. 3 and 4.

Figure 3:
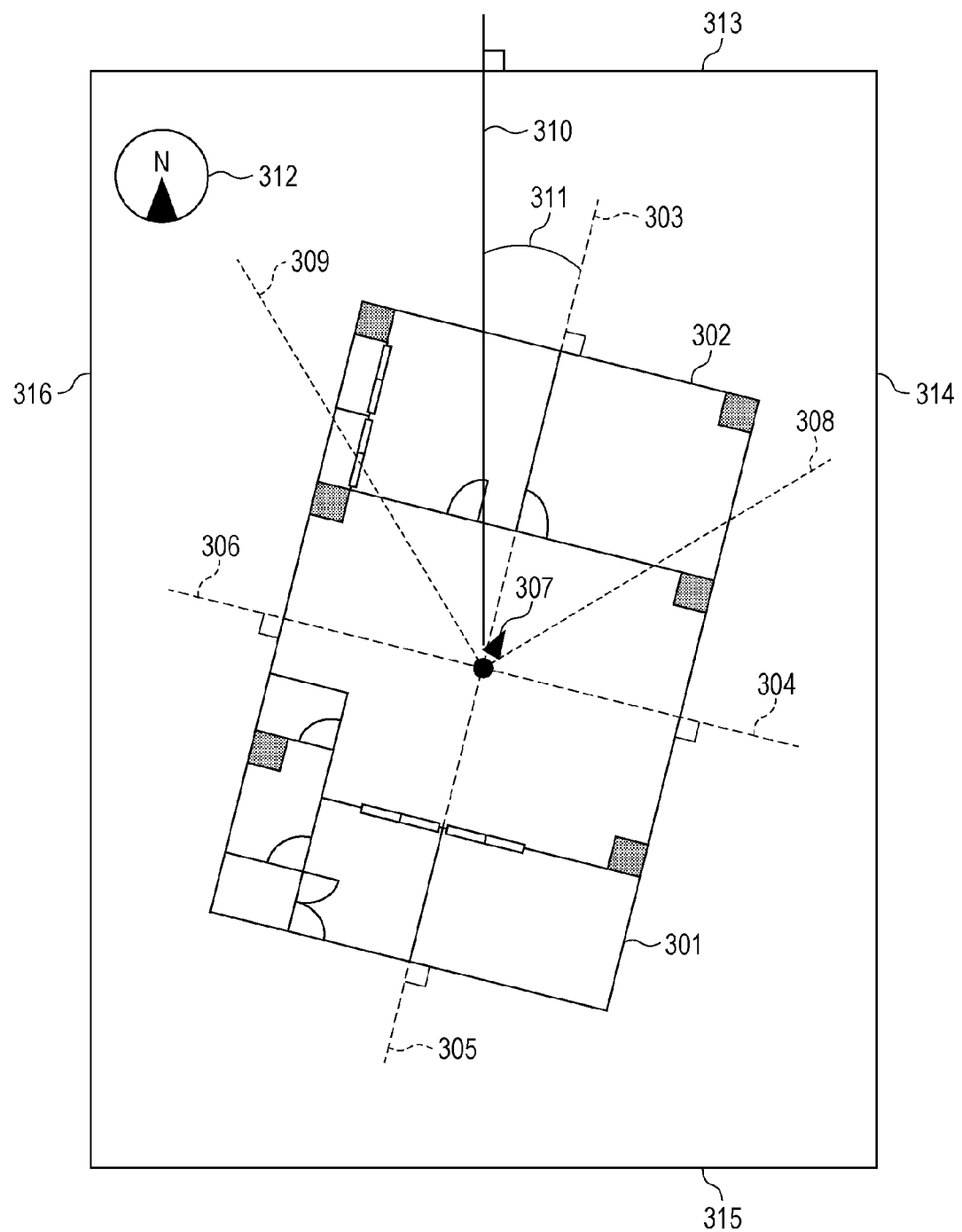
FIG. 3 schematically illustrates correction angle calculation processing in step S7 in FIG. 2.
Figure 4:
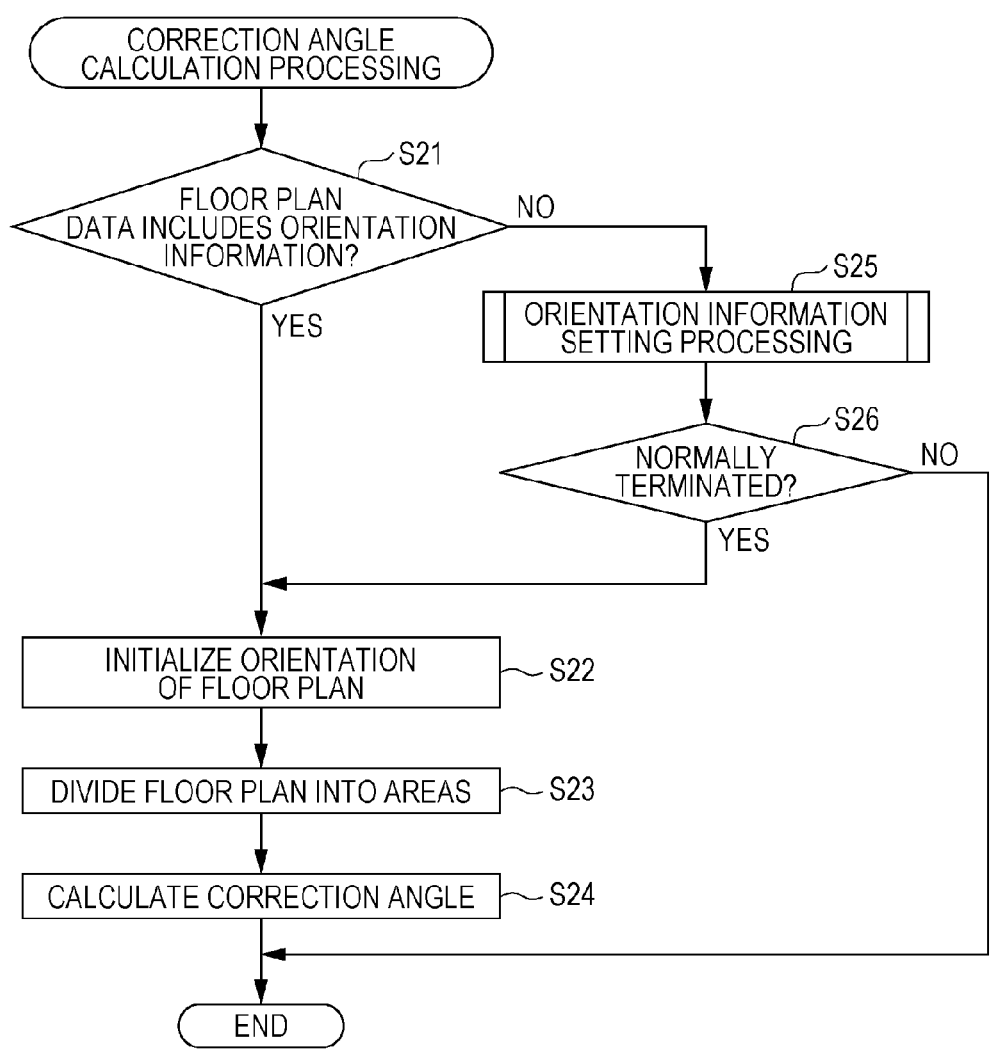
FIG. 4 is a flowchart illustrating the flow of the correction angle calculation processing in step S7 in FIG. 2.

FIG. 3 schematically illustrates the correction angle calculation processing in step S7 in FIG. 2, and FIG. 4 is a flowchart illustrating the flow of the correction angle calculation processing in step S7 in FIG. 2.

In the correction angle calculation processing, the display controller 105 first decides whether the floor plan data 110 or 115, whichever is applicable, includes orientation information (step S21). If the display controller 105 decides that the floor plan data 110 or 115 includes orientation information (the result in step S21 is Yes), the display controller 105 performs initialization processing to have the orientation of the floor plan match the direction (north, south, east or west) indicated in the orientation information (step S22). In FIG. 3, the orientation of a floor plan 301 has been initialized so that the top of the display screen is orientated toward the north as indicated by a direction 312.

Next, the display controller 105 divides the floor plan 301 into a plurality of areas (step S23).

The display controller 105 then calculates a correction angle for each divided area (step S24), as described below. As illustrated in FIG. 3, the floor plan 301 is rectangular. The display controller 105 divides the floor plan 301 with bisectors each of which divides an angle formed by adjacent normals, which are two of four normals 303, 304, 305, and 306 to the exterior walls of the floor plan 301. Thus, the floor plan 301 is divided into four areas. The display controller 105 then calculates a correction angle for each divided area. For example, a correction angle for the area defined by a bisector 308 that divides an angle formed by the normals 303 and 304 and a bisector 309 that divides an angle formed by the normals 303 and 306 is an angle 311 formed by a normal 310 to the upper edge 313 of the display screen frame on the display unit 112 and the normal 303 present in the area.

Therefore, if a direction 307 in which the information processing terminal 101 is oriented is within the area defined by the bisectors 308 and 309, the display controller 105 corrects the floor plan 301 by the angle 311 and displays the corrected floor plan 301 on the display unit 112. This enables the upper edge 302 of the exterior walls of the floor plan 301 to be made parallel to the upper edge 313 of the display screen frame on the display unit 112. For simplicity, only the area defined by the bisectors 308 and 309 has been described above. In practice, however, the display controller 105 calculates the correction angle for other areas in the same way. Although, in this embodiment, the upper edge 302 of the floor plan 301 is made parallel to the upper edge 313 of the display screen frame on the display unit 112, the present disclosure is not limited to this. The upper edge 302 of the floor plan 301 may be made parallel to any one of the right edge 314, bottom edge 315, and left edge 316 of the display screen frame on the display unit 112. Although normals have been used in the above description to calculate the correction angle, this is not a limitation to a mathematical method of calculating the correction angle in the present disclosure. The correction angle may be calculated by using, for example, a line segment parallel to the upper edge 302 of the exterior walls in the floor plan 301 and a line segment parallel to the upper edge 313 of the display screen frame on the display unit 112.

The display controller 105 may calculate the correction angle for only one of the plurality of divided areas. Alternatively, the display controller 105 may calculate the correction angle for at least one of the plurality of divided areas. Although, in this embodiment, the display controller 105 divides the floor plan 301 into four areas, the present disclosure is not limited to this. The floor plan 301 may be divided into two areas, three areas, or five or more areas.

Figure 5:
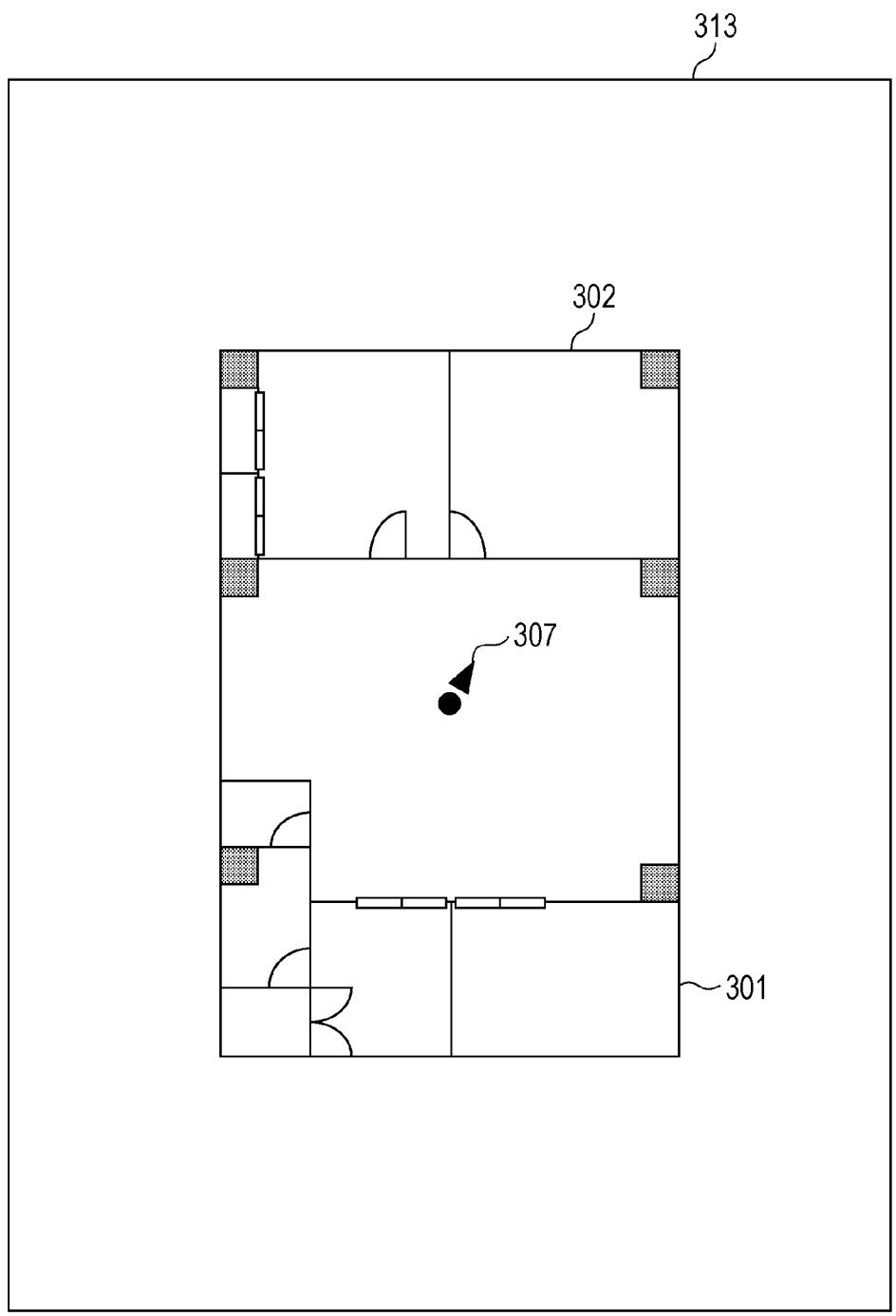
FIG. 5 illustrates an example of a corrected floor plan displayed on a display screen.

FIG. 5 illustrates an example of a corrected floor plan displayed on a display screen.

As illustrated in FIG. 5, the floor plan 301 displayed on the display screen has been rotated so that the upper edge 302 of the floor plan 301 is made parallel to the upper edge 313 of the display screen.

If, in the correction angle calculation processing in FIG. 4, the display controller 105 decides that the floor plan data 110 or 115, whichever is applicable, does not include orientation information (the result in step S21 is No), the display controller 105 performs orientation information setting processing to set orientation information, which will be described later (step S25).

Next, the display controller 105 decides whether the orientation information setting processing has been normally terminated (step S26). If orientation information has been set in the floor plan data 110 or 115, the display controller 105 decides that the orientation information setting processing has been normally terminated. If orientation information has not been set in the floor plan data 110 or 115, the display controller 105 decides that the orientation information setting processing has not been normally terminated. If the display controller 105 decides that the orientation information setting processing has not been normally terminated (the result in step S26 is No), the display controller 105 terminates the orientation information setting processing. If the display controller 105 decides that the orientation information setting processing has been normally terminated (the result in step S26 is Yes), the display controller 105 proceeds to processing in step S22.

Here, the flow of the orientation information setting processing in step S25 in FIG. 4 will be described in detail with reference to FIGS. 6 to 8.

Figure 6:
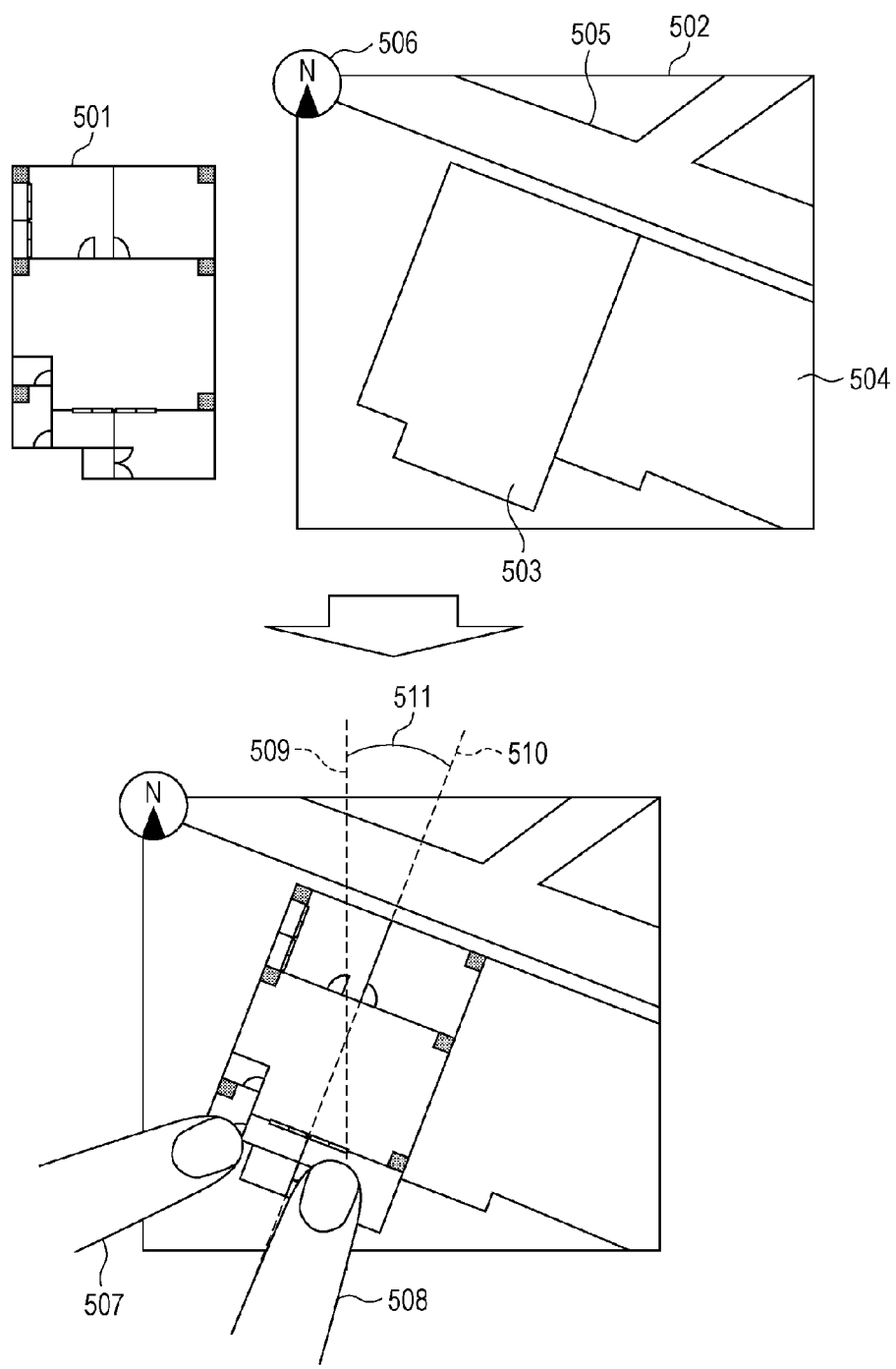
FIG. 6 schematically illustrates orientation information setting processing in step S25 in FIG. 4.

FIG. 6 schematically illustrates the orientation information setting processing in step S25 in FIG. 4. FIG. 7 is a flowchart illustrating the flow of the orientation information setting processing in step S25 in FIG. 4. FIG. 8 schematically illustrates a variation of the orientation information setting processing in step S25 in FIG. 4.

Figure 7:
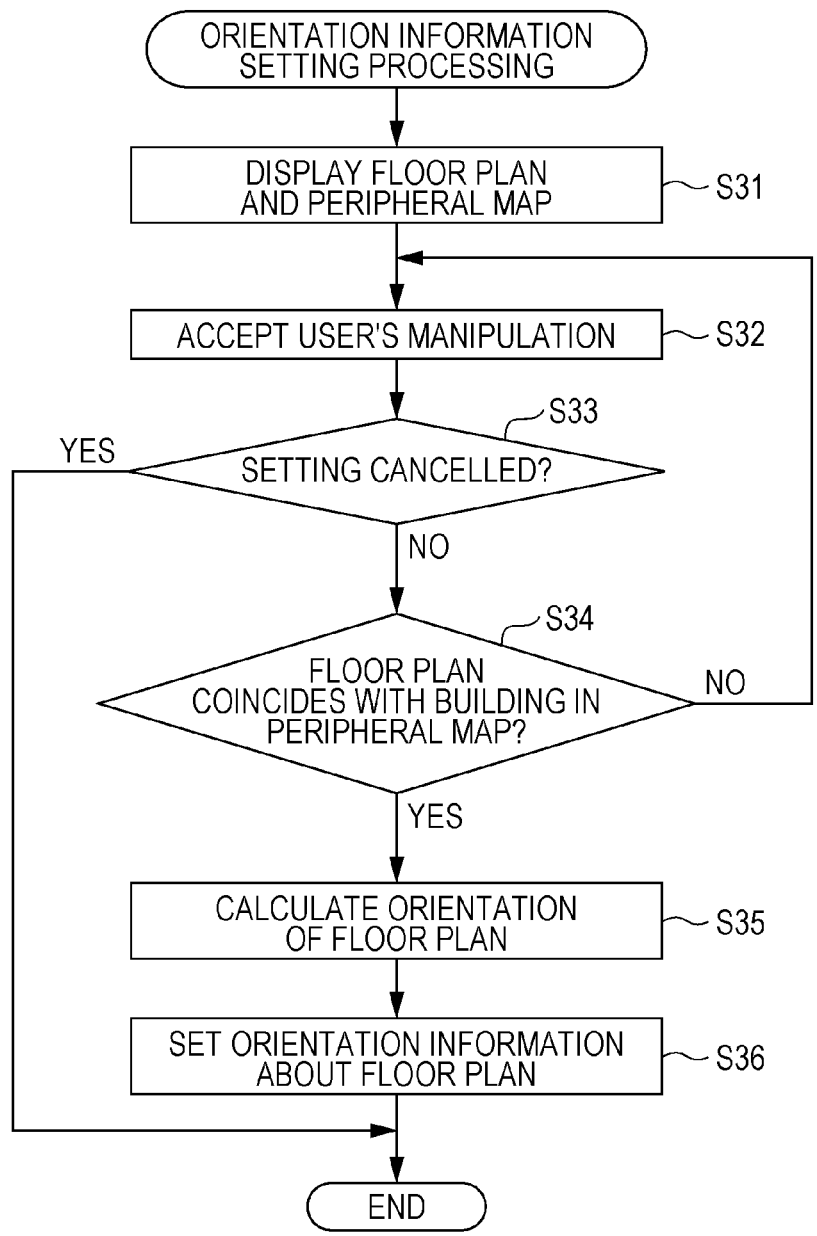
FIG. 7 is a flowchart illustrating the flow of the orientation information setting processing in step S25 in FIG. 4.

In FIG. 7, the display controller 105 first displays, on the display unit 112, a floor plan and a peripheral map around the building corresponding to the floor plan (step S31).

In FIG. 6, to set orientation information, the display controller 105 first displays, on the display unit 112, a floor plan object 501 in which the floor plan data 110 or 115 can be moved, magnified, contracted, or rotated and a peripheral map object 502 that can be moved, magnified, contracted, or rotated. The peripheral map object 502 may have been included in the floor plan data 115 stored in the external server 114 through the Internet 113. Alternatively, current position information may be obtained through a global positioning system (GPS) receiver included in the information processing terminal 101 and a peripheral map may be obtained from the Internet 113 according to the obtained current position information. Alternatively, a building address entered by the user may be accepted, and the peripheral map object 502 may be obtained from the Internet 113 according to the accepted address. The peripheral map object 502 includes at least a direction 506 on the map and position information about a building 503. The peripheral map object 502 may further include position information about a peripheral building 504, position information about a road 505, or the like. The user can manipulate the floor plan object 501 by a touch, a click, or another action.

Referring again to FIG. 7, the display controller 105 then accepts a user's manipulation made for the displayed floor plan and peripheral map (step S32). At this time, the user overlaps the floor plan object 501 on the peripheral map object 502 by moving, magnifying, contracting, or rotating the floor plan object 501 on the screen.

FIG. 6 illustrates an example of a display screen on which the user has overlapped the floor plan object 501 on an area, in the peripheral map object 502, that indicates the building 503 by manipulating the floor plan object 501 with two fingers 507 and 508.

The display controller 105 then decides whether cancellation of the orientation information setting has been commanded by a user's manipulation (step S33). If the display controller 105 decides that cancellation of the orientation information setting has been commanded by a user's manipulation (the result in step S33 is Yes), the display controller 105 terminates the orientation information setting processing.

If the display controller 105 decides that cancellation of the orientation information setting has not been commanded by a user's manipulation (the result in step S33 is No), the display controller 105 decides whether the floor plan object 501 coincides with the building 503 in the peripheral map object 502 (step S34).

In this case, the display controller 105 may decide whether the floor plan object 501 completely coincides with the building 503 in the peripheral map object 502. Alternatively, the display controller 105 may not necessarily decide whether the floor plan object 501 completely coincides with the building 503 in the peripheral map object 502. That is, when the floor plan object 501 is overlapped on the building 503 in the peripheral map object 502, the display controller 105 may calculate the size of the non-overlapping areas of the floor plan object 501 and building 503. The display controller 105 may then decide whether the calculated size of the non-overlapping areas is equal to or smaller than a prescribed value. If the calculated size is equal to or smaller than the prescribed value, the display controller 105 may decide that the floor plan object 501 coincides with the building 503. If the calculated size exceeds the prescribed value, the display controller 105 may decide that the floor plan object 501 does not coincide with the building 503.

If the display controller 105 decides that the floor plan object 501 does not coincide with the building 503 in the peripheral map object 502 (the result in step S34 is No), the display controller 105 returns to the processing in step S32 to accept a user's manipulation.

If the display controller 105 decides that the floor plan object 501 coincides with the building 503 in the peripheral map object 502 (the result in step S34 is Yes), the display controller 105 calculates the orientation of the floor plan according to an amount by which the rotational angle of the floor plan object 501 has changed from its initial state and to orientation information about the peripheral map object 502 (step S35). Specifically, the display controller 105 calculates the orientation of the floor plan from an angle 511 formed by a normal 509 to the upper edge of the floor plan object 501 in the initial state and a normal 510 to the upper edge of the moved floor plan object 501. Thus, the display controller 105 can calculate an angle through which a direction in which the normal 510 to the upper edge of the floor plan object 501 extends is inclined with respect to the north direction.

Next, the display controller 105 sets the calculated orientation as orientation information about the floor plan data 110 (step S36).

Although, in the example in FIG. 6, the floor plan object 501 is moved as described above, the present disclosure is not limited to this. The peripheral map object 502 may be moved. A variation in the directional information setting processing, in which the peripheral map object 502 is moved, will be described below.

Figure 8:
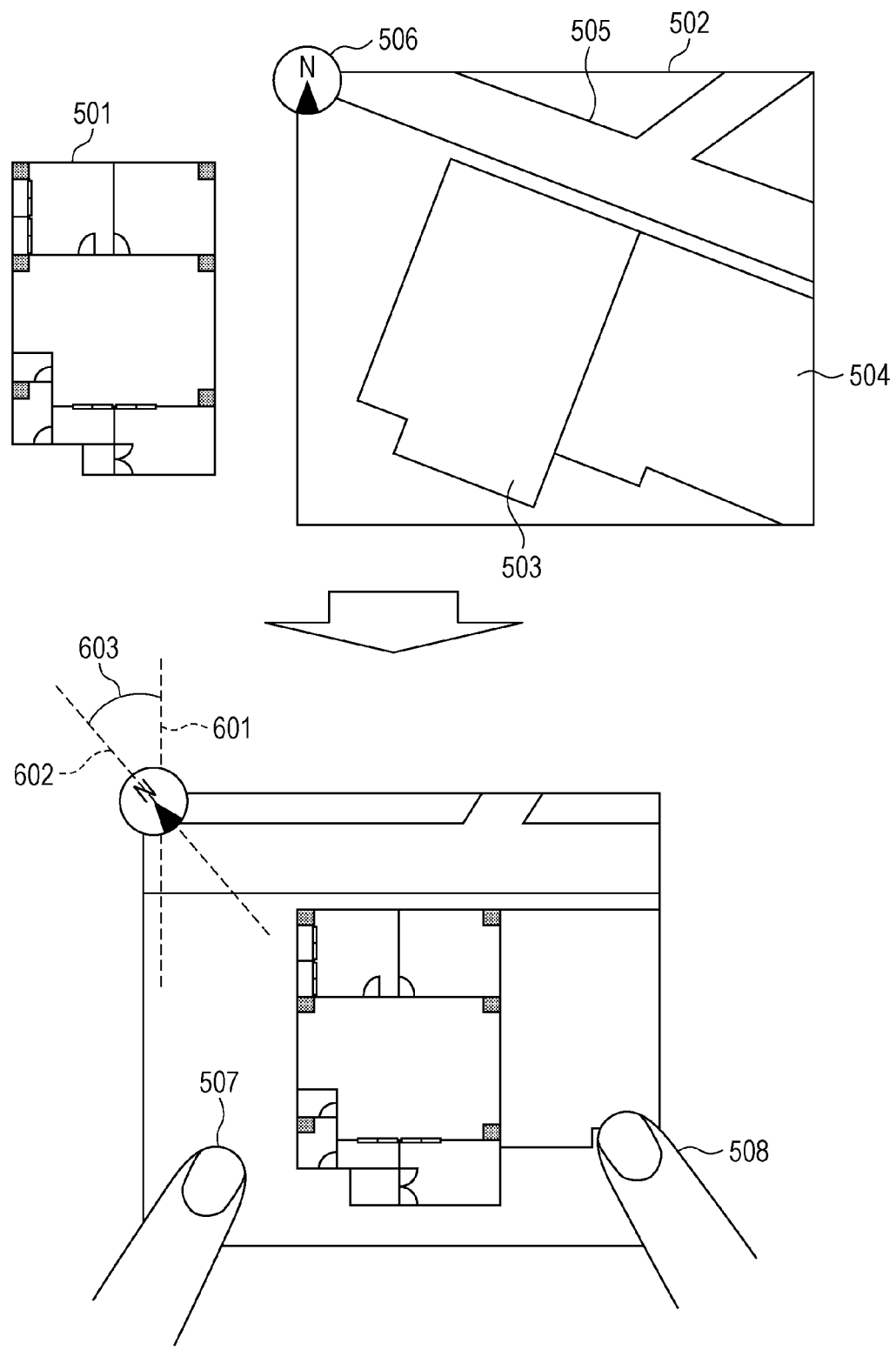
FIG. 8 schematically illustrates a variation in the orientation information setting processing in step S25 in FIG. 4.

FIG. 8 schematically illustrates a variation in the orientation information setting processing in this embodiment. Constituent elements in FIG. 8 that are the same as in FIG. 6 are denoted by the same reference numerals and their descriptions will be omitted. In this variation, the user can move, magnify, contract, and rotate the peripheral map object 502 on the display screen by a touch, a click, or another action. Upon detection of a user's manipulation, the display controller 105 moves, magnifies, contracts, or rotates the peripheral map object 502 on the screen and displays the peripheral map object 502 by overlapping it below the floor plan object 501.

FIG. 8 illustrates an example of a display screen on which the user has overlapped an area, in the peripheral map object 502, that indicates the building 503 below the floor plan object 501 by manipulating the peripheral map object 502 with the two fingers 507 and 508. As in the orientation information setting processing in FIGS. 6 and 7, the display controller 105 calculates the orientation of the floor plan according to an amount by which the rotational angle of the peripheral map object 502 has changed from its initial state and to orientation information about the peripheral map object 502. Specifically, the display controller 105 calculates the orientation of the floor plan from an angle 603 formed by a straight line 601 extending from the south side in the peripheral map object 502 in the initial state toward the north direction and a straight line 602 extending from the south side in the moved peripheral map object 502 toward the north direction. Thus, the display controller 105 can calculate an angle through which a direction in which the normal to the upper edge of the floor plan object 501 is inclined with respect to the north direction. The display controller 105 sets the calculated orientation as the orientation information about the floor plan data 110. To simplify the above description, normals have been used to calculate the orientation of the floor plan, but this is not a limitation to a mathematical method of calculating the orientation of the floor plan in the present disclosure. The orientation of the floor plan may be calculated by using, for example, a line segment parallel to the upper edge of the floor plan object 501 in the initial state in FIG. 6 and a line segment parallel to the upper edge of the moved floor plan object 501.

Next, the flow of the display control processing in step S9 in FIG. 2 will be described in detail with reference to FIGS. 9 to 12.

Figure 9:
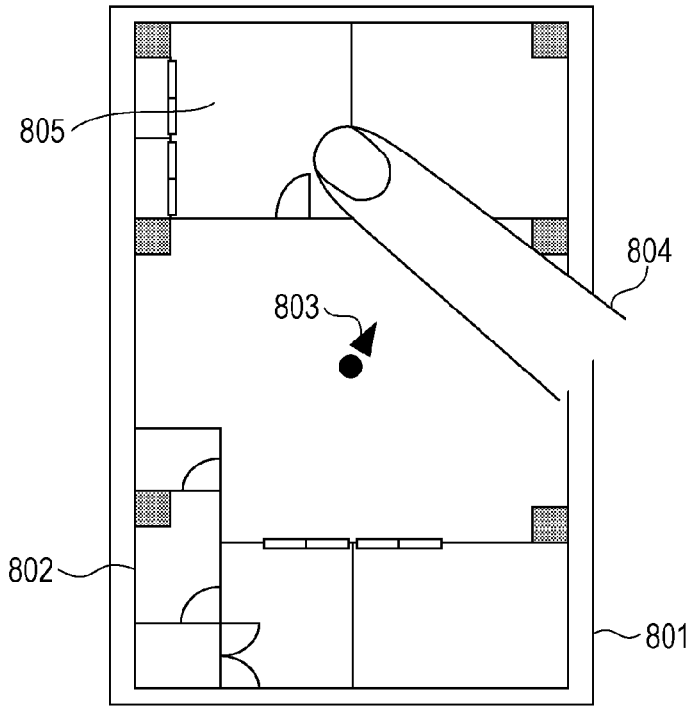
FIG. 9 illustrates an example of a display screen on which an entire floor plan is displayed on a display unit.
Figure 10:
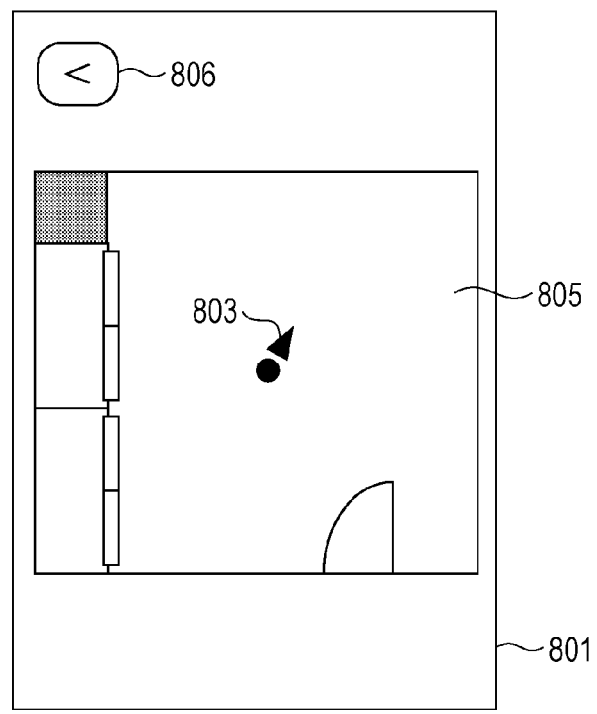
FIG. 10 illustrates an example of a display screen on which a single room in the floor plan is individually displayed on the display unit.

FIGS. 9 and 10 illustrate examples of user interfaces, in this embodiment, on a manipulation screen on the information processing terminal 101. FIG. 9 illustrates an example of a display screen on which an entire floor plan is displayed on the display unit 112. FIG. 10 illustrates an example of a display screen on which a single room in the floor plan is individually displayed on the display unit 112.

To implement the manipulation screen, the display controller 105 in the information processing terminal 101 displays a floor plan 802 within a display screen frame 801 on the display unit 112, as illustrated in FIG. 9. The display controller 105 may display a marker 803, which indicates the orientation of the top of the information processing terminal 101, inside or outside the area of the floor plan 802. In addition, when the user selects (touches) a particular room 805 in the floor plan 802 with a finger 804 or the like, the display controller 105 may individually display the floor plan of the room 805, as illustrated in FIG. 10. In this case, the display controller 105 preferably switches between the entire floor plan display and individual display by, for example, displaying, on the manipulation screen, a switching button 806 that causes the display controller 105 to switch back to the entire display.

Figure 11:
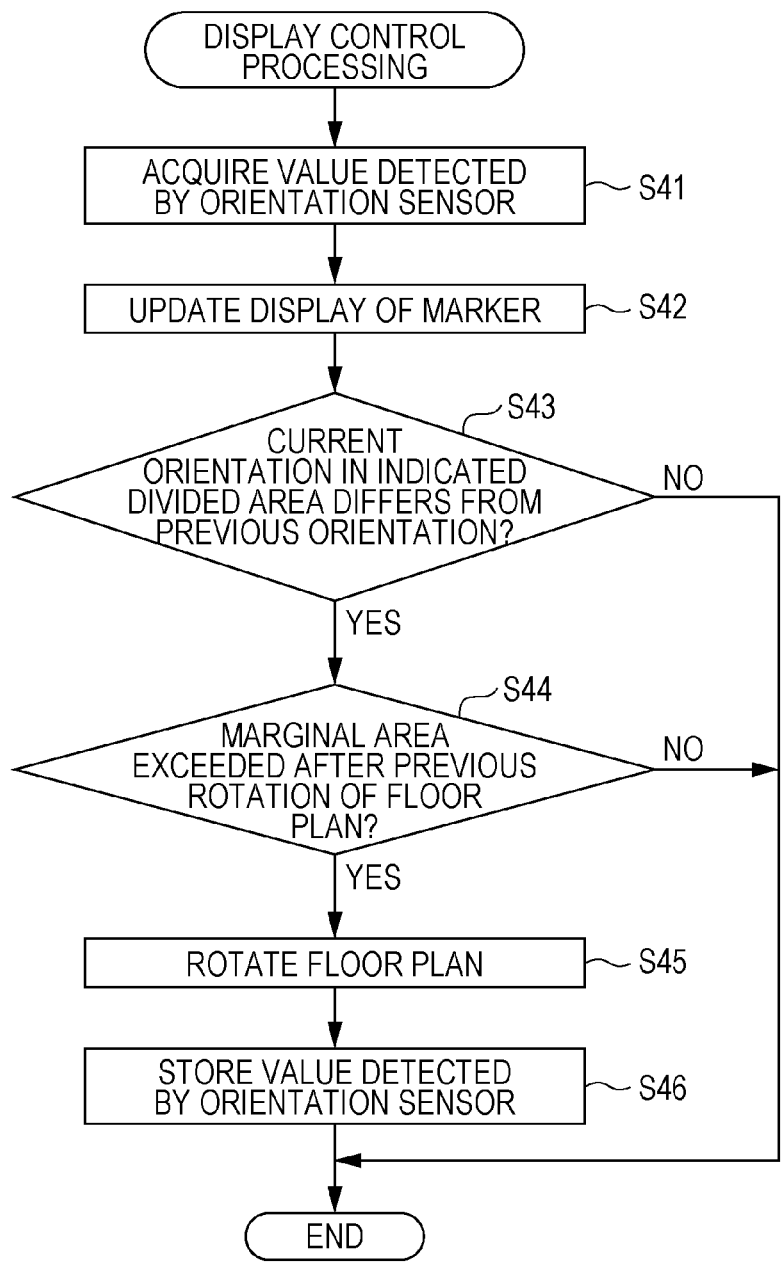
FIG. 11 is a flowchart illustrating the flow of display control processing in step S9 in FIG. 2.

Next, the flow of the display control processing on the manipulation screen in FIG. 9 will be described. FIG. 11 is a flowchart illustrating the flow of the display control processing in step S9 in FIG. 2.

The display controller 105 first acquires a value detected by the orientation sensor 111 included in the information processing terminal 101 (step S41). The value detected by the orientation sensor 111 indicates the orientation of the top of the information processing terminal 101.

The display controller 105 then updates the display of the marker 803, which indicates the orientation of the top of the information processing terminal 101, on the manipulation screen in FIG. 9 according to the value detected by the orientation sensor 111 and then acquired by the display controller 105 (step S42). The marker 803 is not necessarily displayed; if non-display of the marker 803 is set in advance, the processing in step S42 is skipped.

The display controller 105 then decides whether, in the indicated divided area, which is one of the plurality of areas into which the floor plan has been divided in step S23 in the correction angle calculation processing in FIG. 4, the current value detected by the orientation sensor 111 differs from the previous value detected by the orientation sensor 111 (step S43). Since the previous value detected by the orientation sensor 111 has been stored in the storage unit 103, the display controller 105 reads out the previous value detected by the orientation sensor 111 from the storage unit 103.

If the display controller 105 decides that, in the indicated divided area, the current value detected by the orientation sensor 111 does not differ from the previous value detected by the orientation sensor 111, that is, in the indicated divided area, the current value detected by the orientation sensor 111 is the same as the previous value detected by the orientation sensor 111 (the result in step S43 is No), the display controller 105 terminates the display control processing.

If the display controller 105 decides that, in the indicated divided area, the current value detected by the orientation sensor 111 differs from the previous value detected by the orientationسensor 111 (the result in step S43 is Yes), the display controller 105 decides whether the orientation of the top of the information processing terminal 101 has changed beyond a marginal area after the previous rotation of the floor plan (step S44)

Figure 12:
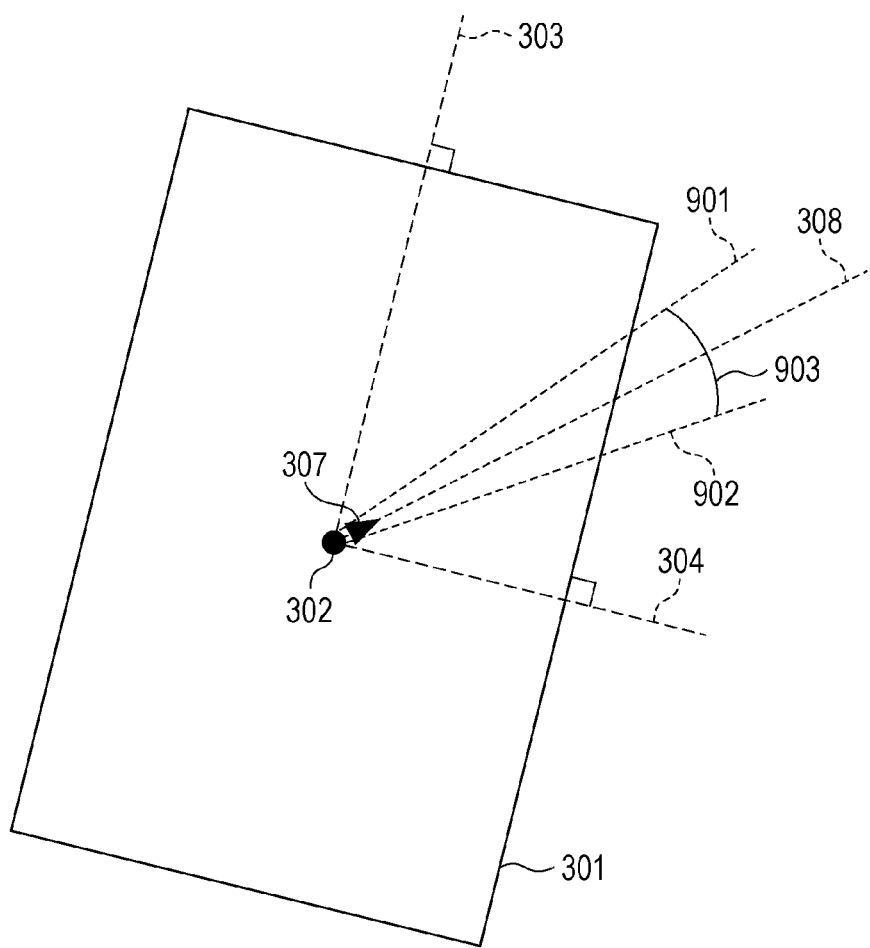
FIG. 12 schematically illustrates processing to rotate a floor plan.

FIG. 12 schematically illustrates processing to rotate a floor plan. Here, processing will be described in which the display controller 105 decides whether to rotate a floor plan by areas into which the floor plan has been divided in the correction angle calculation processing. Constituent elements in FIG. 12 that are the same as in FIG. 3 are denoted by the same reference numerals and their descriptions will be omitted.

It is assumed that the orientation of the information processing terminal 101 had been within a divided area defined by the bisector 308 and bisector 309, but has now changed clockwise in terms of the orientation (that is, from the north direction to the east direction) and has exceeded the bisector 308, which is a borderline of the divided area in the floor plan. In this case, the display controller 105 decides that the current orientation of the information processing terminal 101 is in a divided area in which the current orientation differs from the previous orientation (the result in step S43 is Yes). The display controller 105 then decides whether the orientation of the information processing terminal 101 has changed beyond the marginal area after the previous rotation of the floor plan (step S44). The marginal area is, for example, an area, in FIG. 12, defined by an angle 903 formed by line segments 901 and 902, between which the bisector 308, which is a borderline of the divided area, is present. There is no particular limitation to the central angle of the marginal area; the central angle only needs to be, for example, 45 degrees or small.

If the display controller 105 decides that the orientation of the top of the information processing terminal 101 has not changed beyond the marginal area after the previous rotation of the floor plan (the result in step S44 is No), the display controller 105 terminates the display control processing without rotating the floor plan. This suppresses rotation processing for the floor plan from being frequently performed in a situation in which the orientation of the top of the information processing terminal 101 slightly changes around a borderline (bisector 308) of the divided area.

If the display controller 105 decides that the orientation of the top of the information processing terminal 101 has changed beyond the marginal area after the previous rotation of the floor plan (the result in step S44 is Yes), the display controller 105 rotates the floor plan through the calculated angle 311 (step S45).

The display controller 105 then stores the value detected by the orientation sensor 111 and then acquired by the display controller 105 in the storage unit 103, terminating the display control processing (step S46).

Thus, it is possible to rotate the floor plan displayed on the display unit 112 while at least one edge of the wall surfaces in the floor plan is made parallel to at least one edge of the display screen according to the orientation of the top of the information processing terminal 101. This can avoid the user interface problem that a floor plan on the display unit 112 does not fit to the screen frame or a displayed floor plan deviates from the screen frame. It is also possible to control the displaying of a screen so that the on-screen position of a device to be manipulated comes close to the position of the actual device that the user sees.

It is also possible for a home controller that uses a floor plan to control a display screen so that the on-screen position of a device to be manipulated comes close to the position the actual device that the user sees. Accordingly, a user who uses a home controller can intuitively specify a desired device.

In this embodiment, an edge to be made parallel to one edge of the display screen on the display unit 112 has been described as an exterior wall of the floor plan. However, in a case in which the display controller 105 has a function of individually displaying a prescribed area in a floor plan as illustrated in FIG. 10, an edge to be made parallel to one edge of the display screen on the display unit 112 may be a wall surface of a room present in the floor plan.

Although, in this embodiment, the orientation of the top of the information processing terminal 101 has been detected, the present disclosure is not limited to this. The display controller 105 may rotate a floor plan through an angle calculated so that at least one edge of the boundaries in the floor plan is made parallel to at least one edge of the display screen without detecting the orientation of the top of the information processing terminal 101, and may display the rotated floor plan on the display unit 112.

Second Embodiment

In the first embodiment of the present disclosure, the method of controlling the displaying of a floor plan according to the orientation of the top of the information processing terminal 101 has been described. While the user is not at home, however, there is no advantageous effect in rotating the floor plan with the orientation of the information processing terminal 101 taken into consideration and the rotating of the floor plan may impair the usability of the system. The second embodiment addresses this problem.

Figure 13:
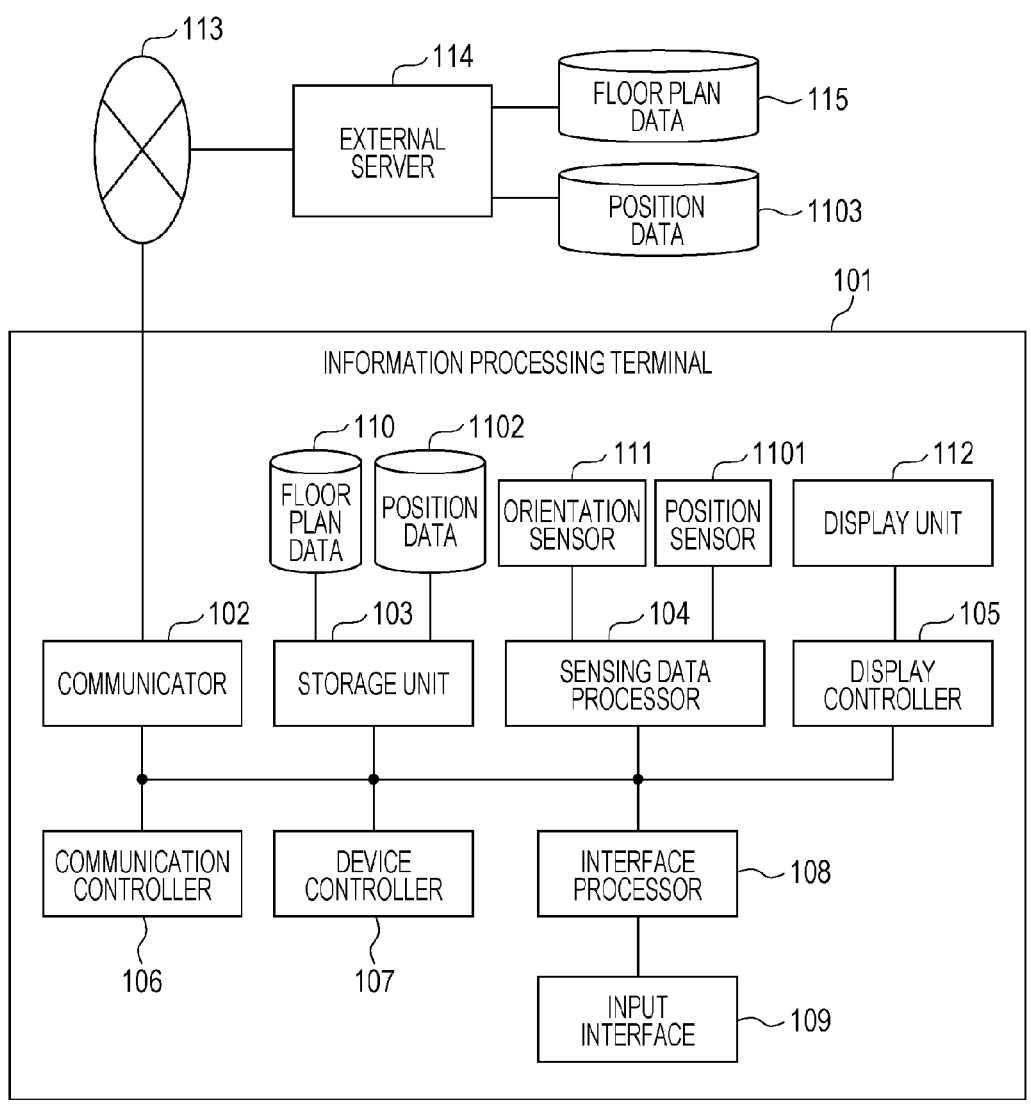
FIG. 13 illustrates an aspect of the structure of a display control system in a second embodiment of the present disclosure.

FIG. 13 illustrates an aspect of the structure of a display control system in the second embodiment of the present disclosure.

In addition to the constituent elements described in the first embodiment, the information processing terminal 101 further includes a position sensor 1101, as illustrated in FIG. 13. The storage unit 103 stores position data 1102 that indicates the position of a building (the home of the user, for example) to be remotely manipulated. Constituent elements in FIG. 13 that are the same as in the first embodiment are denoted by the same reference numerals and their detailed descriptions will be omitted. The position sensor 1101, which is formed with, for example, a GPS receiver, acquires the current position of the information processing terminal 101. The position sensor 1101 is not limited to a GPS receiver. The current position may be acquired in another method.

The position sensor 1101 detects the position of the information processing terminal 101, the position being on a map. Specifically, the display controller 105 decides whether to rotate the layout drawing (floor plan) according to the position detected by the position sensor 1101. The display controller 105 then compares the position of the information processing terminal 101 detected by the position sensor 1101 with the position of a facility corresponding to the layout drawing (floor plan), the position being on the map, to decide whether the information processing terminal 101 is present in the facility. If the display controller 105 decides that the information processing terminal 101 is not present in the facility, the display controller 105 does not rotate the layout drawing (floor plan). If the display controller 105 decides that the information processing terminal 101 is present in the facility, the display controller 105 rotates the layout drawing (floor plan).

Next, the flow of the display control processing in the second embodiment will be described with reference to FIGS. 2 and 14.

First, the user manipulates the information processing terminal 101 to start a procedure for remotely manipulating a device. Then, the display controller 105 sequentially executes processing as in the display control method in the first embodiment, which has been described with reference to FIG. 2, starting step S1. In the second embodiment, however, only the display control processing in step S9 in FIG. 2 is replaced with display control processing in FIG. 14.

Figure 14:
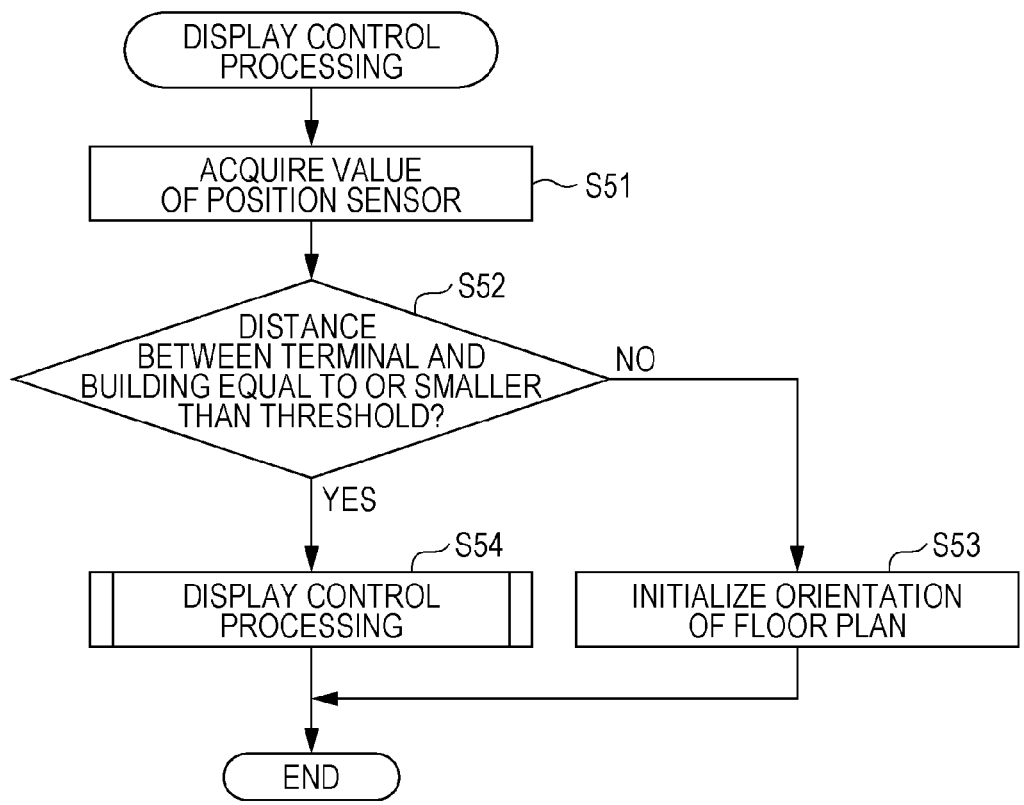
FIG. 14 is a flowchart illustrating a flow in display control processing in the second embodiment of the present disclosure.

FIG. 14 is a flowchart illustrating a flow in display control processing in the second embodiment of the present disclosure.

First, the display controller 105 acquires a value detected by the position sensor 1101 to detect the position of the information processing terminal 101, the position being on a map (step S51).

Next, to decide whether to rotate the floor plan to be displayed, the display controller 105 compares the detected current position of the information processing terminal 101, the position being on the map, with the position of the building to be remotely manipulated to decide whether a distance between the information processing terminal 101 and building is equal to or smaller than a predetermined threshold (step S52). Position information about the building to be remotely manipulated may be installed from an external storage unit and stored in the storage unit 103 in advance. Alternatively, during execution of the display control processing, position data 1103 stored in the external server 114 may be downloaded by the communicator 102 through the Internet 113 and may then be stored in the storage unit 103, as the position information about the building to be remotely manipulated. The threshold may be automatically set according to the size of the floor plan or may be set to a user-specified value.

If the display controller 105 decides from a comparison result in step S52 that the distance between the position of the information processing terminal 101, the position being on the map, and the position of the building to be remotely manipulated exceeds the predetermined threshold (the result in step S52 is No), the display controller 105 does not rotate the floor plan. Instead, the display controller 105 initializes the orientation of the floor plan so that at least one edge of the wall surfaces in the floor plan is made parallel to at least one edge of the screen on the display unit 112 and terminates the display control processing (step S53).

If the display controller 105 decides that the distance between the position of the information processing terminal 101, the position being on the map, and the position of the building to be remotely manipulated is equal to or smaller than the predetermined threshold (the result in step S52 is Yes), the display controller 105 executes the same display control processing as in the first embodiment (in step S9 in FIG. 2) to update the display of the floor plan on the display screen and terminates the display control processing (step S54).

Thus, it is possible to rotate the floor plan displayed on the display unit 112 while at least one edge of the wall surfaces in the floor plan is made parallel to at least one edge of the display screen according to the orientation of the top of the information processing terminal 101 and to prevent the floor plan from being unnecessarily rotated when, for example, the user is not at home.

Third Embodiment

In the second embodiment of the present disclosure, the method of controlling the displaying of a screen according to the orientation of the top of the information processing terminal 101 and to the position of the information processing terminal 101, the position being on a map, has been described. Even if the user is at home (in a building), however, when the user is in a room other than a room in which a device to be manipulated is placed, the rotating of the floor plan is not always effective. The third embodiment is based on this conception.

Figure 15:
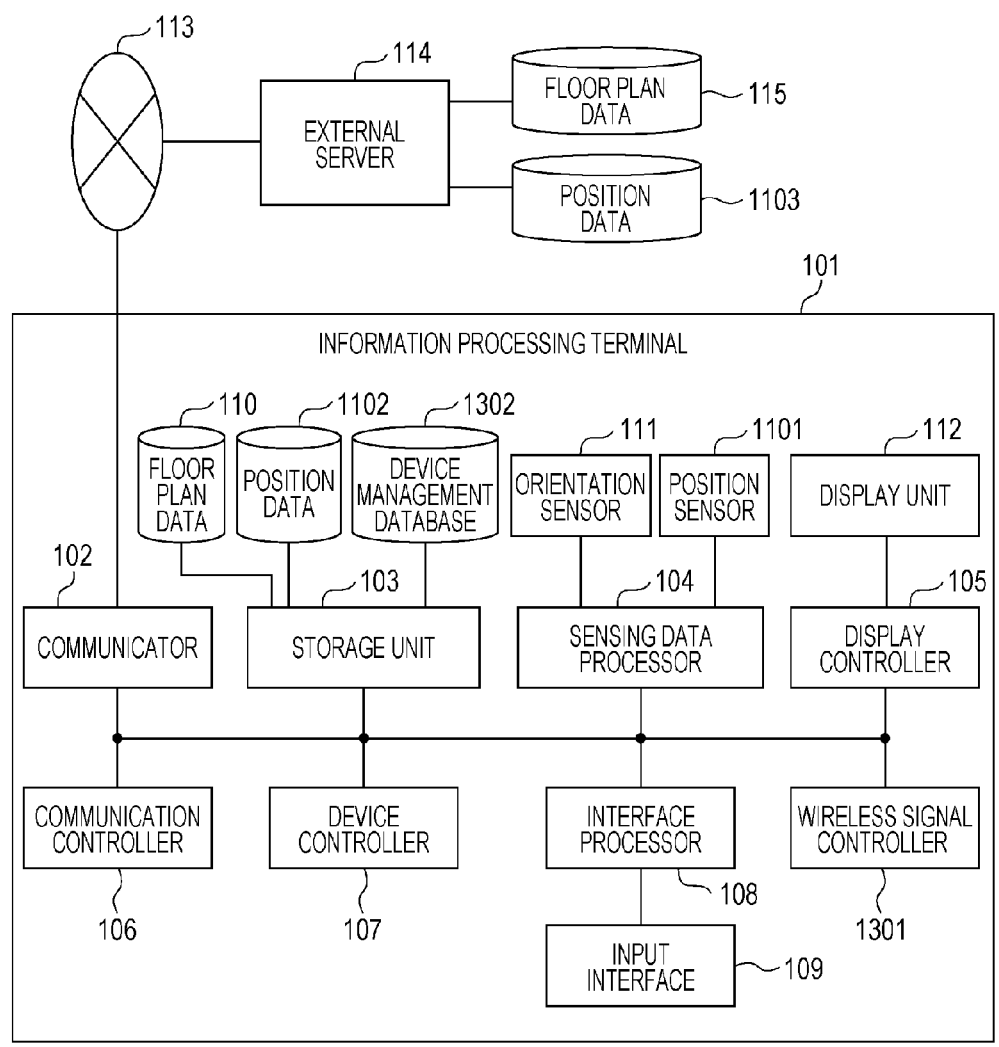
FIG. 15 illustrates an aspect of the structure of a display control system in a third embodiment of the present disclosure.

FIG. 15 illustrates an aspect of the structure of a display control system in the third embodiment of the present disclosure.

In addition to the constituent elements described in the second embodiment, the information processing terminal 101 further includes a wireless signal controller 1301 and a device management database 1302 connected to the storage unit 103, as illustrated in FIG. 15. Constituent elements in FIG. 15 that are the same as in the second embodiment are denoted by the same reference numerals and their detailed descriptions will be omitted. However, the floor plan data 110 in FIG. 15, which is present in the information processing terminal 101, or the floor plan data 115 in the external server 114 is not only the electronic data described in the first or second embodiment, but also has an association with room IDs, which uniquely identify individual rooms in a building.

The wireless signal controller 1301 broadcasts a prescribed wireless signal to the periphery of the information processing terminal 101. The wireless signal controller 1301 also receives a reply signal from a device around the information processing terminal 101 in response the wireless signal broadcasted from the information processing terminal 101. The display controller 105 decides whether to rotate the layout drawing (floor plan) according to the reply signal received by the wireless signal controller 1301.

The display controller 105 also decides whether the information processing terminal 101 is present in a prescribed area in the layout drawing (floor plan) according to at least one of information, included in the reply signal, that indicates the device that has transmitted the reply signal, the radio wave intensity of the reply signal, and a travel time from when the wireless signal is broadcasted until the reply signal is received. If the display controller 105 decides that the information processing terminal 101 is not present in the prescribed area, the display controller 105 does not rotate the layout drawing (floor plan).

The device management database 1302 manages information about devices in a building. Specifically, for each device, the device management database 1302 stores a device ID that identifies the device, a room ID that identifies a room in which the device is placed, a layout type that indicates whether the device is movable, position information that indicates the intra-building position of the device, the received signal strength indicator (RSSI) of a reply signal that is transmitted from the device and received by the information processing terminal 101, and a round-trip time (RTT) from when the information processing terminal 101 broadcasts a wireless signal to the periphery until the information processing terminal 101 receives the reply signal from the device, in correspondence to one another.

Next, an entire flow in the display control method in the third embodiment will be described with reference to the flowcharts in FIGS. 2, 14, and 16.

First, the user manipulates the information processing terminal 101 to start a procedure for remotely manipulating a device. Then, the display controller 105 sequentially executes processing as in the display control method in the first embodiment, which has been described with reference to FIG. 2, starting step S1. In the third embodiment, however, only the display control processing in step S9 in FIG. 2 is replaced with display control processing in FIG. 16.

Figure 16:
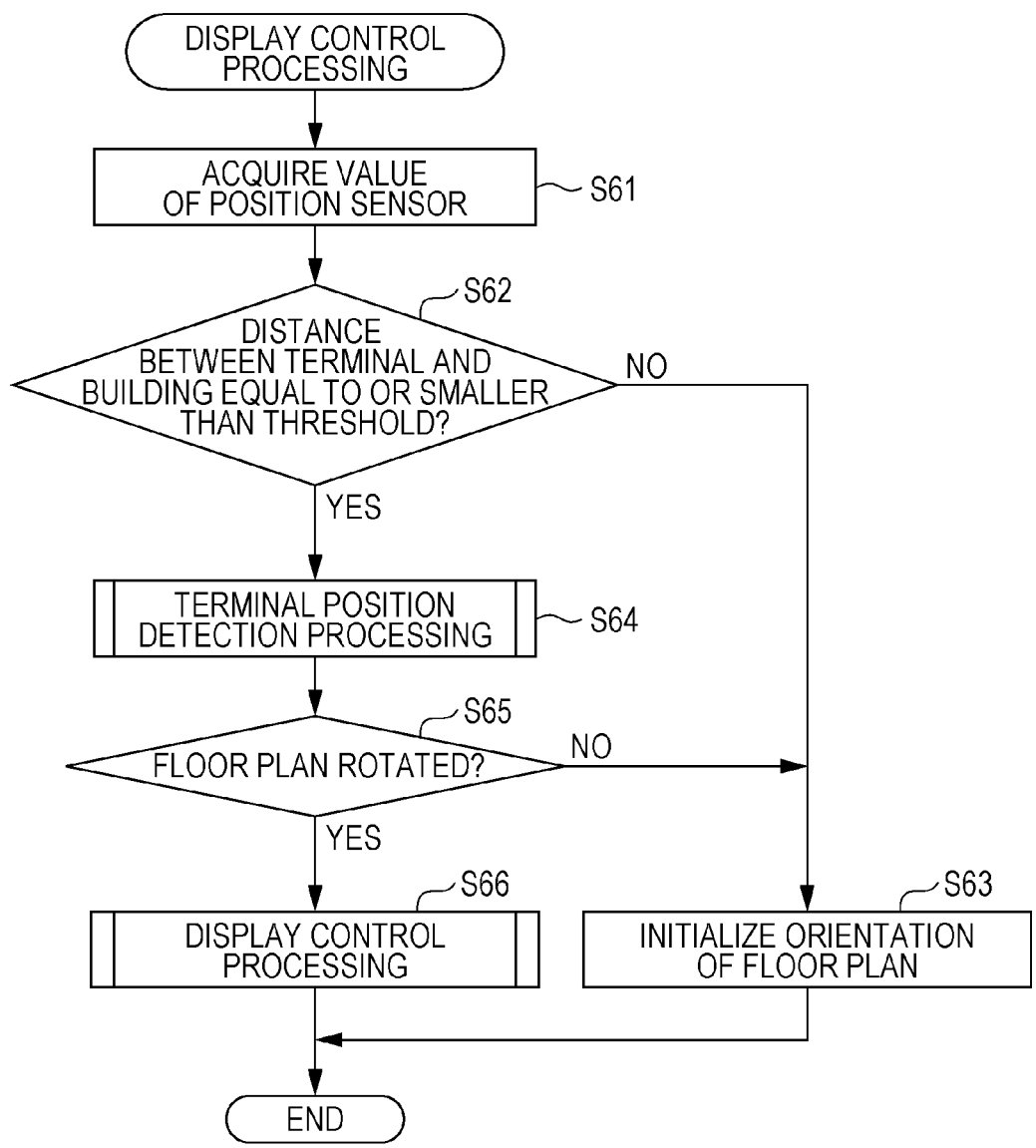
FIG. 16 is a flowchart illustrating a flow in display control processing in the third embodiment of the present disclosure.

FIG. 16 is a flowchart illustrating a flow in display control processing in the third embodiment of the present disclosure. The processing in steps S61 to S63 in FIG. 16 is the same as the processing in steps S51 to S53 in FIG. 14 in the second embodiment. That is, in the display control processing in the third embodiment, the display controller 105 first acquires the value of the position sensor 1101 to detect the position of the information processing terminal 101, the position being on a map, as in the second embodiment (step S61). The display controller 105 then decides whether a distance between the detected position of the information processing terminal 101, the position being on the map, and the position of the building to be remotely manipulated is equal to or smaller than a predetermined threshold (step S62)

If the display controller 105 decides that the distance between the detected position of the information processing terminal 101, the position being on the map, and the position of the building to be remotely manipulated is equal to or smaller than the predetermined threshold (the result in step S62 is Yes), the display controller 105 executes terminal position detection processing described later (step S64).

The display controller 105 then decides whether to rotate the floor plan (step S65). If the display controller 105 decides not to rotate the floor plan (the result in step S65 is No), the display controller 105 does not rotate the floor plan but initializes the orientation of the floor plan so that at least one edge of the wall surfaces in the floor plan is made parallel to at least one edge of the screen on the display unit 112 and terminates the display control processing, as in the second embodiment (step S63).

If the display controller 105 decides to rotate the floor plan (the result in step S65 is Yes), the display controller 105 executes the same display control processing as in the first embodiment (in step S9 in FIG. 2) to update the display of the floor plan on the display screen and terminates the display control processing (step S66).

Next, the flow of the terminal position detection processing in step S64 in FIG. 16 will be described in detail with reference to FIGS. 17 to 20. In the third embodiment, not only a decision as to whether the information processing terminal 101 is present in the building is made, but also the room in which the information processing terminal 101 is present is detected. First, constituent elements needed to implement the terminal position detection processing will be described with reference to FIG. 17.

Figure 17:
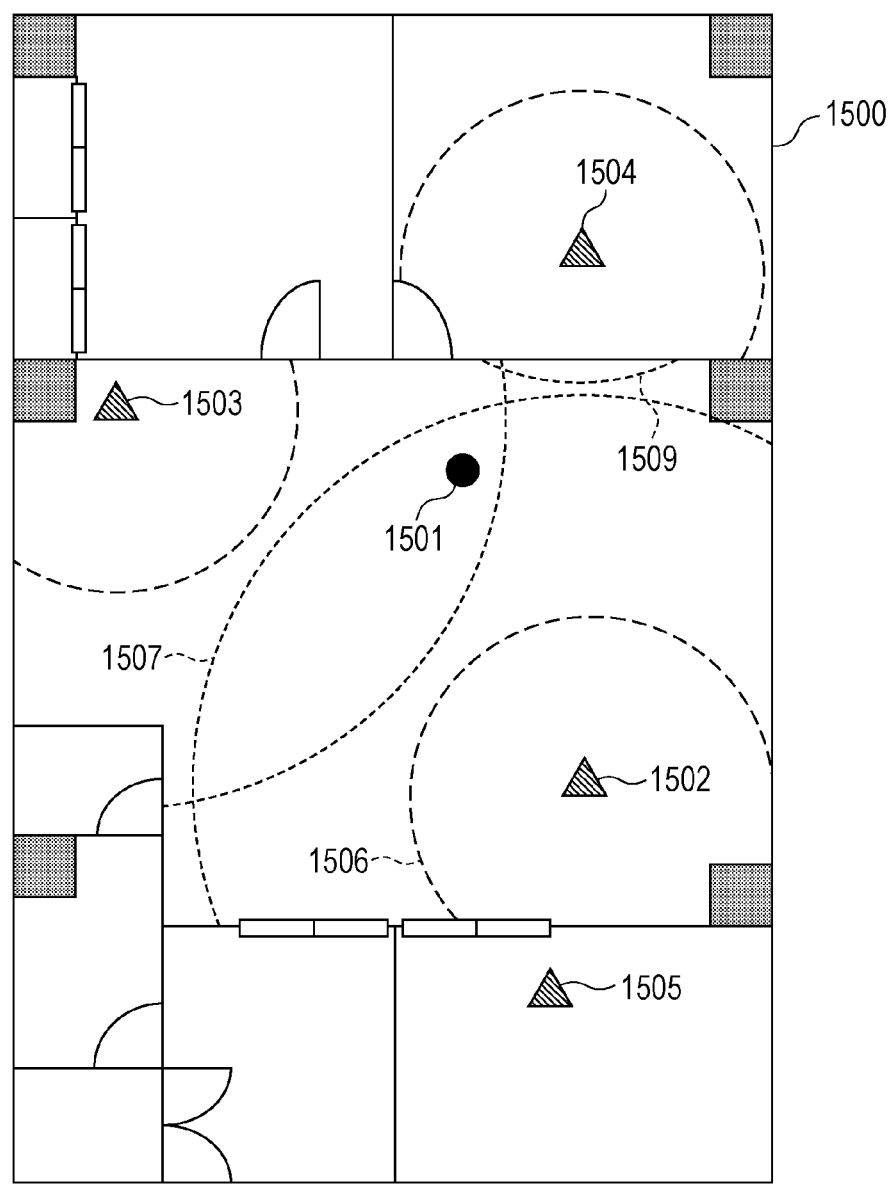
FIG. 17 schematically illustrates terminal position detection processing in the third embodiment of the present disclosure.

FIG. 17 schematically illustrates the terminal position detection processing in the third embodiment of the present disclosure.

In FIG. 17, devices 1502 to 1505 present in a building 1500 and the position 1501 of the information processing terminal 101 are illustrated. A dashed line and a dotted line in FIG. 17 each indicate a coverage of a wireless signal (referred to below as a beacon signal) transmitted from a device, the beacon signal being used to detect the position of the information processing terminal 101 in the home. The beacon signal is a weak radio wave signal; its intensity is lowered while it propagates in the air and is largely lowered particularly while it passes through a wall surface. For example, the device 1502 has a stronger radio wave intensity on a concentric circle 1506 close to the device 1502 than on a concentric circle 1507 distant from the device 1502. The beacon signal transmitted from the device 1504 is largely attenuated while it passes through a wall surface, as indicated by the dotted line 1509. These elements are essential to implement this embodiment.

Next, the flow of the terminal position detection processing in the third embodiment will be described with reference to the flowchart in FIG. 18.

Figure 18:
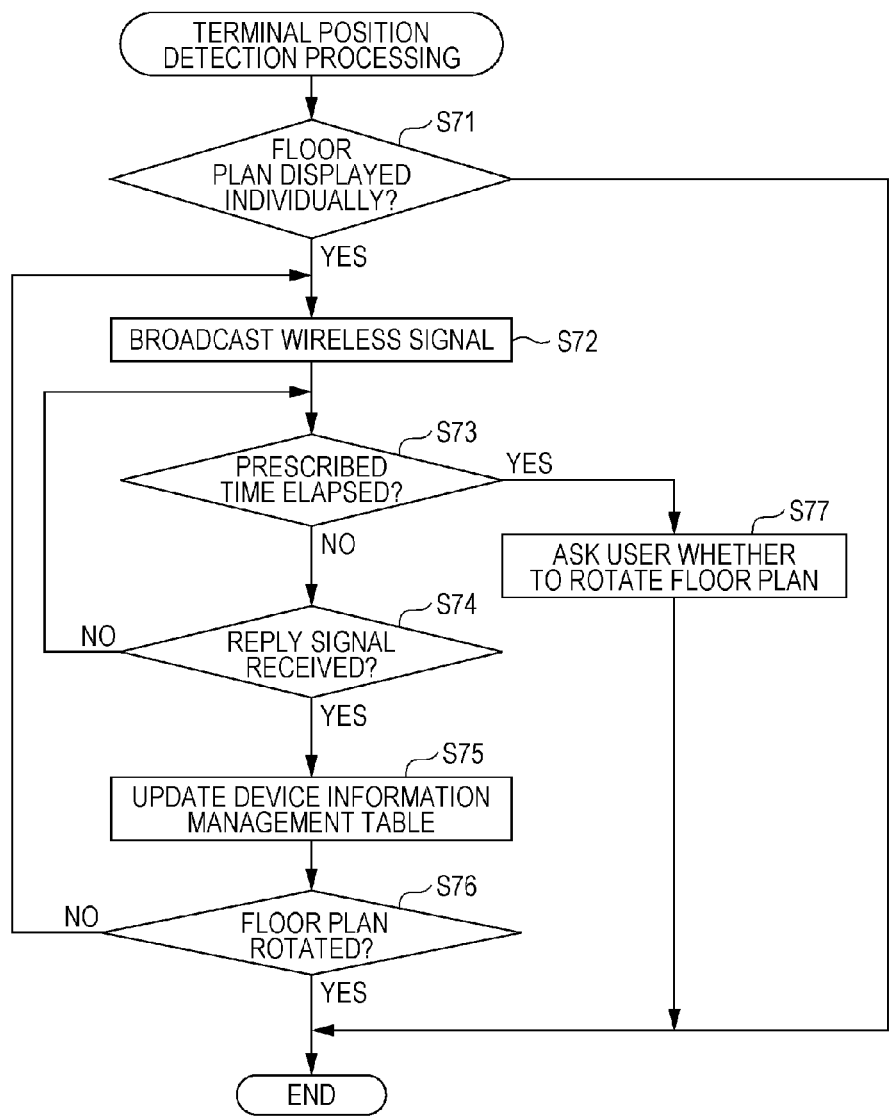
FIG. 18 is a flowchart illustrating the flow of the terminal position detection processing in step S64 in FIG. 16.

FIG. 18 is a flowchart illustrating the flow of the terminal position detection processing in step S64 in FIG. 16.

The display controller 105 first decides whether the floor plan displayed on the display unit 112 is an individual display (step S71). In an individual display, only a single room is displayed on the display screen; the display controller 105 first displays the entire floor plan in the building, after which the display controller 105 accepts a choice of a room selected from the entire floor plan and individually displays the selected room. If the display controller 105 decides that the floor plan is not an individual display (the result in step S71 is No), the display controller 105 decides that the floor plan does not need to be rotated and terminates the terminal position detection processing.

If the display controller 105 decides that the floor plan is an individual display (the result in step S71 is Yes), the wireless signal controller 1301 broadcasts a wireless signal (beacon signal) to the periphery of the information processing terminal 101 (step S72). A device that has received the beacon signal broadcasted from the information processing terminal 101 transmits a beacon signal as a reply signal.

Then, the wireless signal controller 1301 decides whether a prescribed time has elapsed after the broadcasting of the wireless signal (step S73). If the wireless signal controller 1301 decides that the prescribed time has not elapsed (the result in step S73 is No), the wireless signal controller 1301 decides whether a reply signal has been received from a peripheral device (step S74). If the wireless signal controller 1301 decides that a reply signal has not been received (the result in step S74 is No), the wireless signal controller 1301 returns to the processing in step S73.

If the wireless signal controller 1301 decides that a reply signal has been received (the result in step S74 is Yes), the display controller 105 updates a device information management table stored in the device management database 1302 according to the contents of the received reply signal (step S75).

Figure 19:
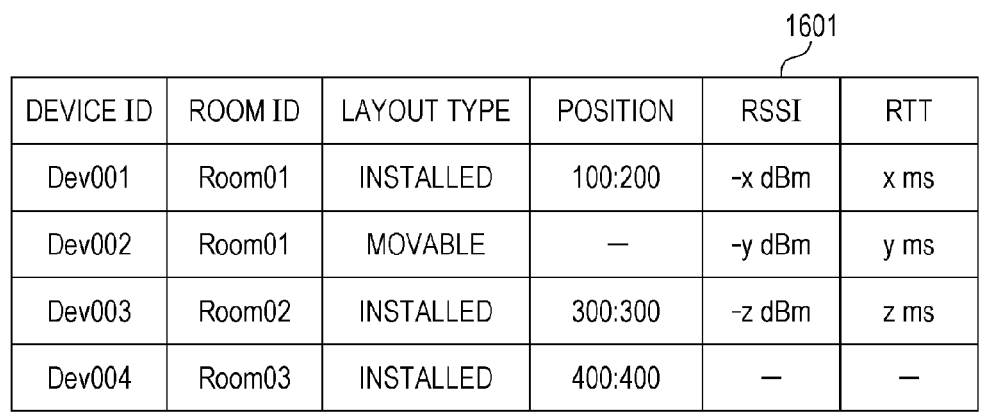
FIG. 19 illustrates an example of a device information management table stored in a device management database.

FIG. 19 illustrates an example of the device information management table stored in the device management database 1302. The device information management table 1601 in FIG. 19 manages information about devices in a building. Specifically, for each device, the device information management table 1601 stores a device ID that identifies the device, a room ID that identifies a room in which the device is placed, a layout type that indicates whether the device is movable, position information that indicates the intra-building position of the device, the RSSI of a beacon signal that is transmitted from the device and received by the information processing terminal 101, and an RTT from when the information processing terminal 101 broadcast a wireless signal to the periphery until the information processing terminal 101 receives the beacon signal from the device as the reply signal, in correspondence to one another.

The device IDs, room IDs, layout types, and position information about the devices, which are stored in the device information management table 1601, have been already set by the user by executing a prescribed procedure separately.

The reply signal includes the device ID of the device that has transmitted the reply signal. Upon receipt of the reply signal, the display controller 105 updates the RSSI and RTT, in the device information management table 1601, that are associated with the device ID included in the reply signal.

The wireless signal controller 1301 may repeat the processing in step S74 until it receives all receivable reply signals.

Referring again to FIG. 18, after having updated the device information management table 1601, the display controller 105 decides whether to rotate the floor plan with reference to a condition table, stored in the device management database 1302, according to which a decision is made as to whether to update the floor plan (step s76). For example, the display controller 105 decides whether the room in which the information processing terminal 101 is present is the room displayed on the display unit 112. If the display controller 105 decides that the room in which the information processing terminal 101 is present is the room displayed on the display unit 112, the display controller 105 decides to rotate the floor plan. If the display controller 105 decides that the room in which the information processing terminal 101 is present is not the room displayed on the display unit 112, the display controller 105 decides not to rotate the floor plan.

Figure 20:
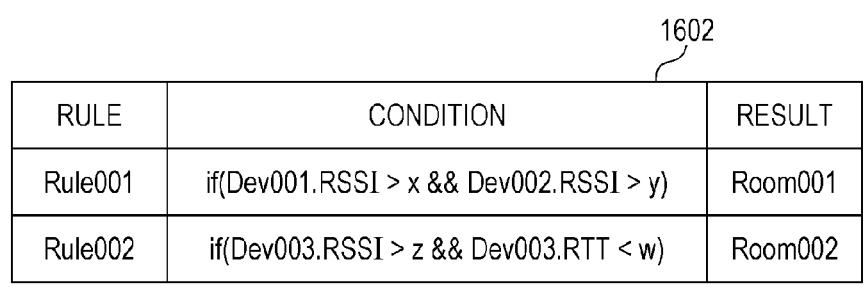
FIG. 20 illustrates an example of a condition table stored in the device management database.

FIG. 20 illustrates an example of the condition table stored in the device management database 1302.

The condition table 1602 illustrated in FIG. 20 indicates rules according to which when any one of the RSSI and RTT in the device information management table 1601 satisfies a prescribed condition, the room in which the information processing terminal 101 is present is determined.

A first rule (Rule001) in the condition table 1602 in FIG. 20, for example, indicates an example in which when the RSSI of a device with an device ID of Dev001 is larger than a prescribed value x and the RSSI of a device with an device ID of Dev002 is larger than a prescribed value y, the position of the information processing terminal 101 is determined to be in the room with a room ID of Room001. Similarly, a second rule (Rule002) indicates an example in which when the RSSI of a device with an device ID of Dev003 is larger than a prescribed value z and the RTT of the device with an device ID of Dev003 is shorter than a prescribed value w, the position of the information processing terminal 101 is determined to be in the room with a room ID of Room002. As algorithms for determining rules in the condition table 1602, various methods can be considered. For example, a particular field in the device information management table 1601 is weighted. In another example, previous contents in the device information management table 1601 are used for learning. The examples in the third embodiment do not restrict the methods of implementing the third embodiment.

The display controller 105 references the condition table 1602 and identifies the room ID of the room in which the information processing terminal 101 is present by using at least one of the RSSI and RTT of the reply signal received from the device.

The display controller 105 then decides whether the identified room ID matches the room ID of the room displayed on the display unit 112. If the display controller 105 decides that the identified room ID matches the room ID of the room displayed on the display unit 112, the display controller 105 decides to rotate the floor plan. If the display controller 105 decides to rotate the floor plan (the result in S76 is Yes), the display controller 105 terminates the terminal position detection processing. If the display controller 105 decides that the identified room ID does not match the room ID of the room displayed on the display unit 112, the display controller 105 decides not to rotate the floor plan. If the display controller 105 decides not to rotate the floor plan (the result in S76 is No), the display controller 105 returns to the processing in step S72 and repeats the processing in steps S72 to S76.

If the wireless signal controller 1301 decides in step S73 that the prescribed time has elapsed (the result in step S73 is Yes), the display controller 105 displays a message to ask the user whether to rotate the floor plan and accepts a choice as to whether to rotate the floor plan from the user (step S77). If the display controller 105 accepts a choice as to whether to rotate the floor plan from the user, the display controller 105 terminates the terminal position detection processing.

In this embodiment, if whether to rotate the floor plan is not decided before a prescribed time elapses from the broadcasting of a wireless signal, the user is asked whether to rotate the floor plan. However, the present disclosure is not limited to this. In step S77, the display controller 105 may infer whether to rotate the floor plan according to the reply signal received from the peripheral device and a rule described in the condition table 1602. If, for example, only one of a plurality of conditions is satisfied, the display controller 105 may determine a room ID under the assumption that the plurality of conditions are satisfied and may infer whether to rotate the floor plan. In this case, the inference result may be wrong, so the display controller 105 may display a dialog on the display unit 112 to receive a feedback for the inference result from the user.

Thus, it is possible to rotate the floor plan displayed on the display unit 112 while at least one edge of the wall surfaces in the floor plan is made parallel to at least one edge of the display screen on the display unit 112 according to the orientation of the top of the information processing terminal 101. When the user is in a room other than the room in which the device to be manipulated is present, it is also possible to prevent unnecessary rotation processing.

In the third embodiment, the information processing terminal 101 includes the position sensor 1101 and the storage unit 103 stores the position data 1102. If, however, the position information about the information processing terminal 101 is not used in the display control processing, the information processing terminal 101 may not include the position sensor 1101, nor may the storage unit 103 store the position data 1102.

Fourth Embodiment

In the first to third embodiments in the present disclosure, the edge to be made parallel to one edge of the screen on the display unit 112 is an exterior wall of the floor plan or a wall surface of a room present in the floor plan, and the shape of the area defined by the exterior walls or wall surfaces is rectangular. However, the shape of an actual floor plan is not always rectangular. Therefore, even when a screen display is simply rotated with respect to a wall surface in the floor plan, the usability of the system may not be necessarily improved.

In the fourth embodiment, however, the display controller 105 creates virtual edges for edge representing exterior walls in the floor plan or edges representing wall surfaces of a room present in the floor plan. By the display controller 105, each created virtual edge is included in an edge to be made parallel to one edge of the screen on the display unit 112.

The display control system in the fourth embodiment has the same structure as the display control system in the first embodiment illustrated in FIG. 1. Differences from the display control system in the first embodiment will be described below.

In the fourth embodiment, the display controller 105 creates virtual borderlines, each of which represents a virtual wall, for a borderline that indicates a wall of a room present in a building. One edge, of the borderlines, parallel to one edge of the display screen includes a created virtual borderline. The display controller 105 creates virtual borderlines so that exterior walls or walls enclosing a room form a convex polygonal shape and that when each borderline representing an exterior wall or a borderline representing a wall of a room is extended, the number of edges of the borderlines representing the exterior walls or the borderlines representing the walls of the room is reduced.

Figure 21:
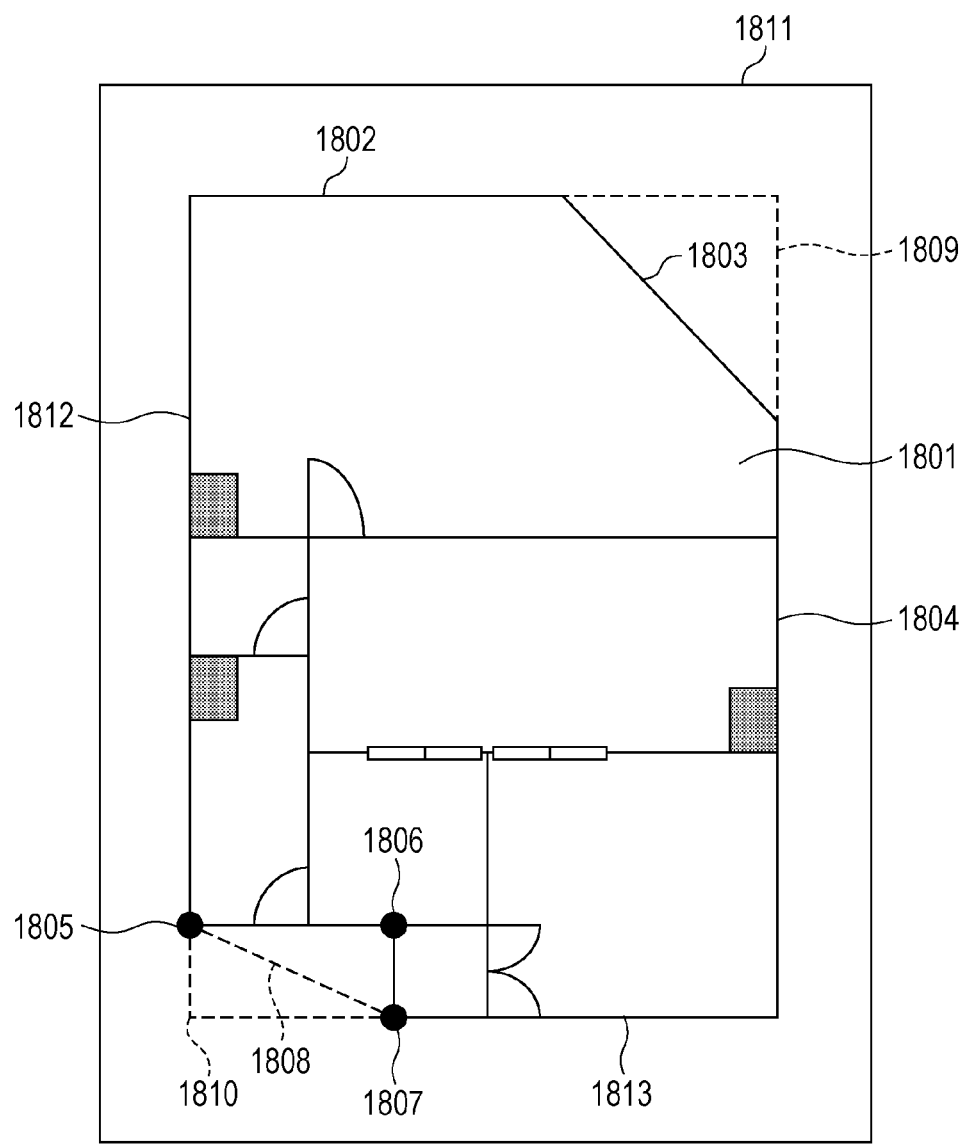
FIG. 21 schematically illustrates processing to create virtual borderlines for a floor plan with a non-rectangular area enclosed by exterior walls.

FIG. 21 schematically illustrates processing to create virtual borderlines for a floor plan with a non-rectangular area enclosed by exterior walls.

As illustrated in FIG. 21, the display controller 105 displays a floor plan 1801 so that its edge 1802 is made parallel to the upper edge 1811 of the display screen on the display unit 112. When the orientation of the top of the information processing terminal 101 is changed clockwise (that is, from the north direction to the east direction) from this state, the display controller 105 rotates the floor plan so that the edge 1802, edge 1803, and edge 1804 are sequentially made parallel to the upper edge 1811 of the display screen on the display unit 112 in that order.

For this floor plan 1801 in FIG. 21, the display controller 105 first creates virtual edges so that the edges enclosing the floor plan 1801 form a convex polygonal shape. In the floor plan 1801, for example, an inner angle formed by a line segment connecting a point 1805 and a point 1806 and a line segment connecting the point 1806 and a point 1807 exceeds 180 degrees. Therefore, the display controller 105 deletes the point 1806 and creates a virtual edge 1808 connecting the point 1805 and point 1807.

Next, the display controller 105 may update virtual edges so as to reduce the number of edges enclosing the floor plan 1801 by extending some of these edges. In FIG. 21, for example, the display controller 105 creates virtual edges 1809 outside the edge 1803 by extending the edge 1802 and edge 1804 and also creates virtual edges 1810 outside the edge 1808 by extending an edge 1812 and edge 1813. Thus, the floor plan 1801 forms a rectangular shape, suppressing the floor plan 1801 from being excessively frequently rotated.

There may be a case in which the display controller 105 cannot easily create appropriate virtual borderlines. In this case, the display controller 105 may delete automatically created virtual borderlines or may add new virtual borderlines, in response to user's manipulations.

Figure 22:
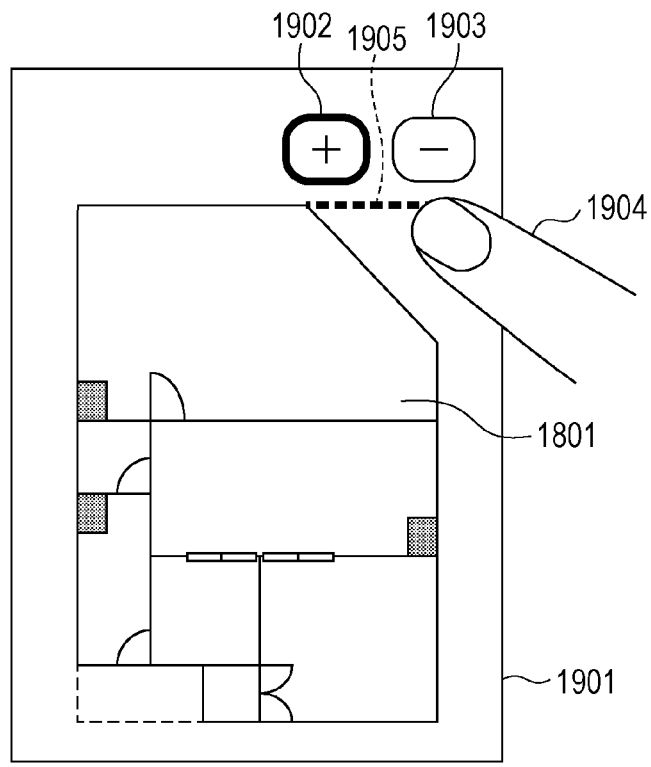
FIG. 22 schematically illustrates an example of a display screen, on the display unit, on which a virtual edge parallel to one edge of the display screen is added in response to user's manipulations.
Figure 23:
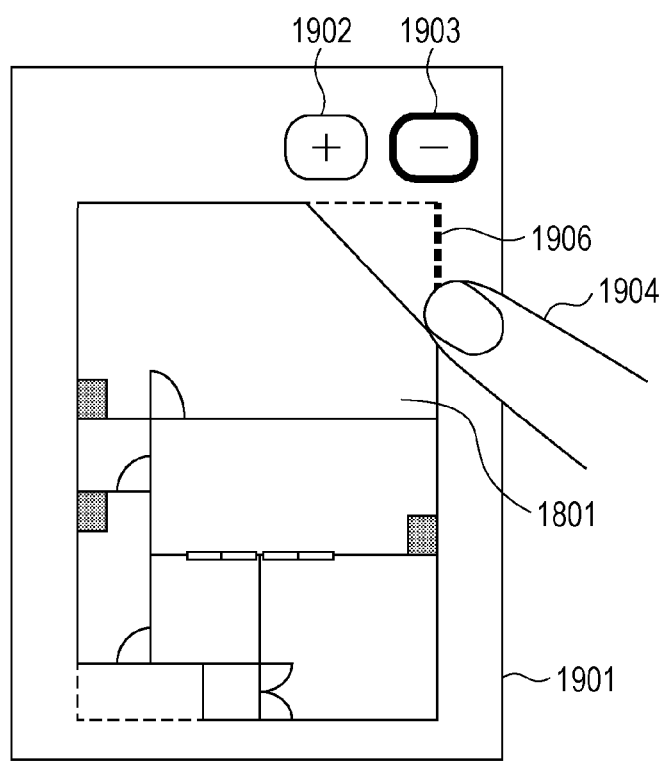
FIG. 23 schematically illustrates an example of a display screen, on the display unit, on which a virtual edge parallel to one edge of the display screen is deleted in response to user's manipulations.

FIGS. 22 and 23 schematically illustrate examples of processing to correct virtual borderlines. FIG. 22 illustrates an example of a display screen, on the display unit 112, on which a virtual edge parallel to one edge of the display screen is added in response to user's manipulations. FIG. 23 illustrates an example of a display screen, on the display unit 112, on which a virtual edge parallel to one edge of the display screen is deleted in response to user's manipulations.

The display controller 105 accepts a user's manipulation to delete a created virtual borderline or add a new virtual borderline. If borderlines are not closed on the floor plan as a result of the addition or deletion of a virtual borderline, the display controller 105 notifies the user.

The display controller 105 displays the floor plan 1801, a wall surface addition button object 1902, and a wall surface deletion button object 1903 on a manipulation screen 1901. When the wall surface addition button object 1902 is selected by a touch with a user's finger 1904 and a line segment is then drawn on the display unit 112 with a touch with the user's finger 1904, the display controller 105 creates the line segment as a new virtual edge. FIG. 22 illustrates a state in which a new virtual edge 1905 is created in response to user's manipulations.

When the wall surface deletion button object 1903 is selected by a touch with the user's finger 1904 and a virtual edge is selected with the user's finger 1904, the display controller 105 deletes the virtual edge selected on the display unit 112. FIG. 23 illustrates a state in which a virtual edge 1906 is deleted in response to user's manipulations.

If the outer edges of the floor plan are not closed upon the completion of processing for adding or deleting a virtual edge in response to a user's manipulation, the display controller 105 may give a warning to the user. To give this warning, a dialog may be displayed on the display unit 112 or the user may be notified with a sound effect or a voice guidance.

Thus, when a floor plan displayed on the display unit 112 is rotated so that at least one edge of the wall surfaces in the floor plan is made parallel to at least one edge of the display screen on the display unit 112 according to the orientation of the top of the information processing terminal 101, the user can freely create an edge to be made parallel to one edge of the display screen on the display unit 112.

Fifth Embodiment

Although, in the first to fourth embodiments described above, examples in which the information processing terminal 101 displays a floor plan of a home have been described, the present disclosure is not limited to this. For example, the information processing terminal 101 may display a layout drawing that indicates the layout of stores in a commercial facility.

Figure 24:
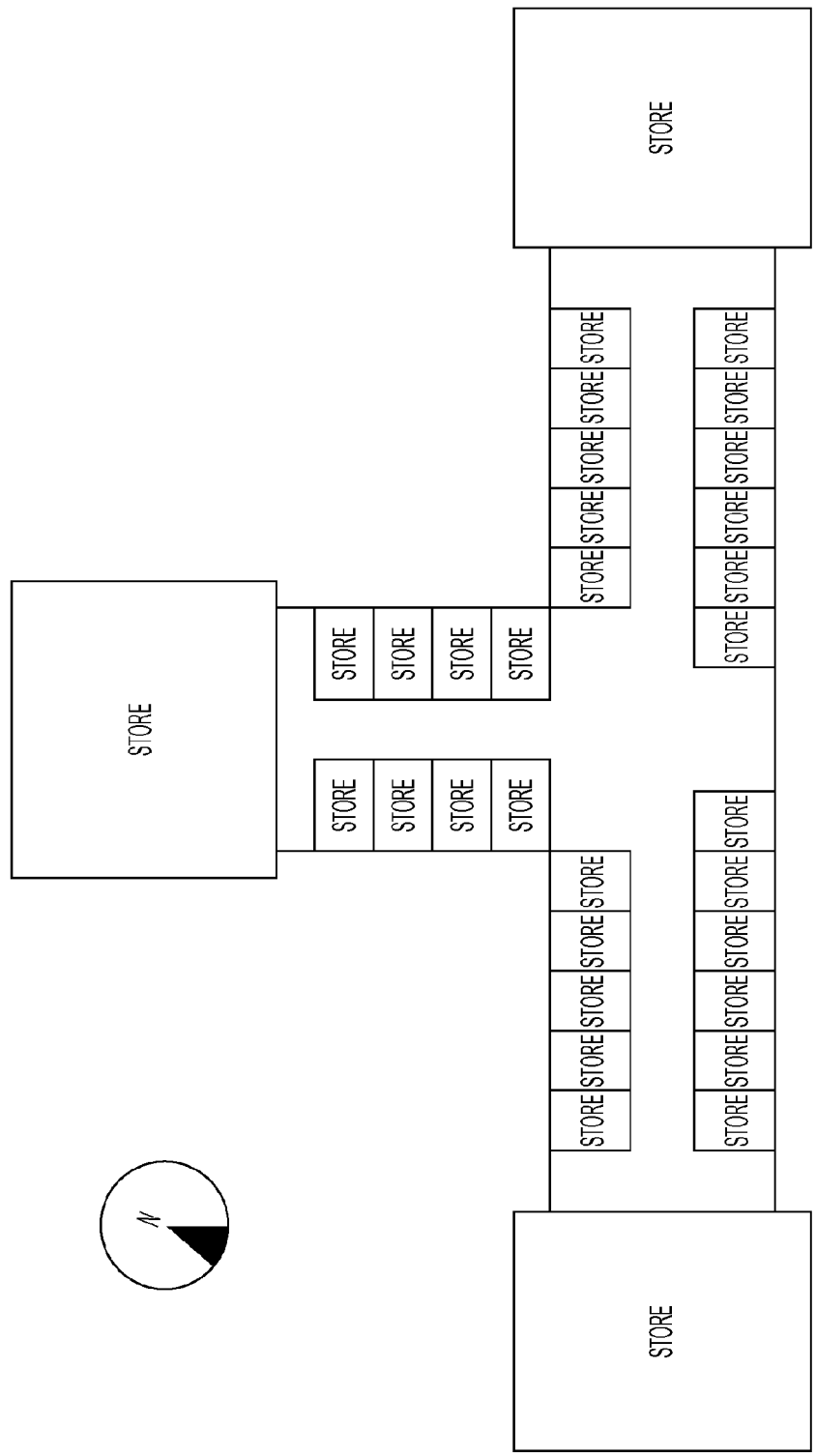
FIG. 24 illustrates an example of a layout drawing that indicates the layout of stores in a shopping mall.

FIG. 24 illustrates an example of a layout drawing that indicates the layout of stores in a shopping mall. As illustrated in FIG. 24, the information processing terminal 101 may display a layout drawing that indicates the layout of a plurality of stores in a shopping mall.

Figure 25:
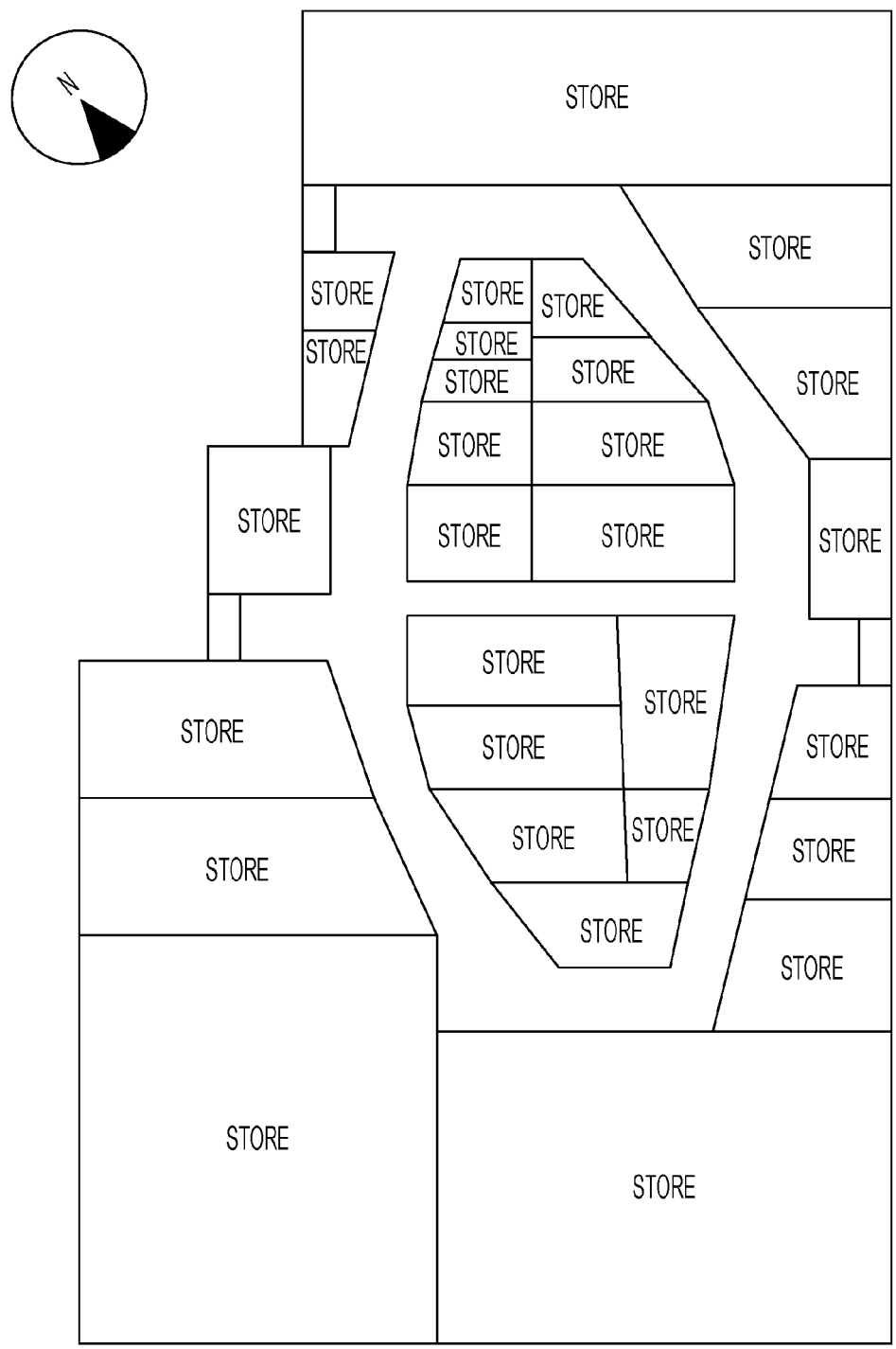
FIG. 25 illustrates an example of a layout drawing that indicates the layout of stores in an underground shopping area.

FIG. 25 illustrates an example of a layout drawing that indicates the layout of stores in an underground shopping area. As illustrated in FIG. 25, the information processing terminal 101 may display the layout of a plurality of stores in an underground shopping area.

The information processing terminal 101 may also display a layout drawing that indicates the layout of buildings in a sightseeing spot such as a temple.

Figure 26:
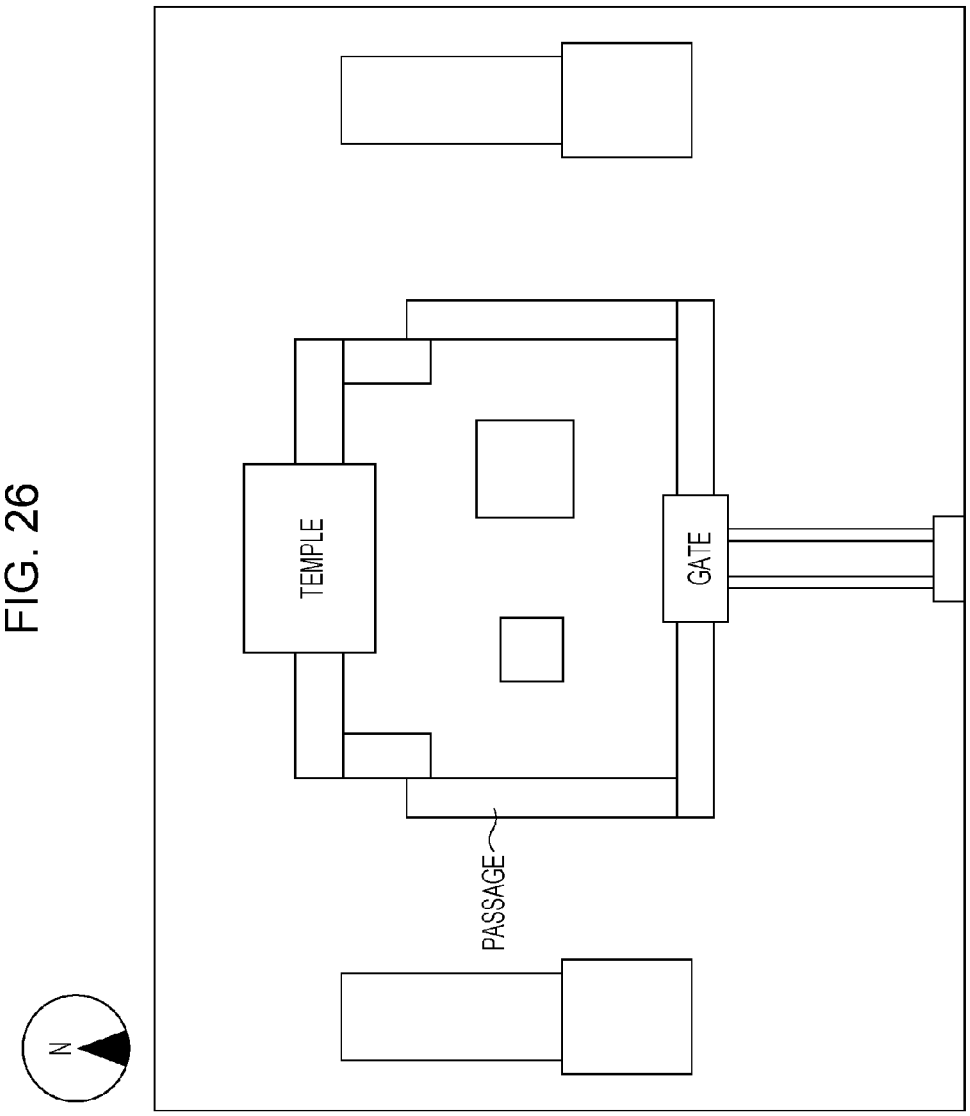
FIG. 26 illustrates an example of a layout drawing that indicates the layout of buildings in facility in a sightseeing spot.

FIG. 26 illustrates an example of a layout drawing that indicates the layout of buildings in a facility in a sightseeing spot. As illustrated in FIG. 26, the information processing terminal 101 may display a layout drawing that indicates the layout of a plurality of buildings in a sightseeing spot.

Figure 27:
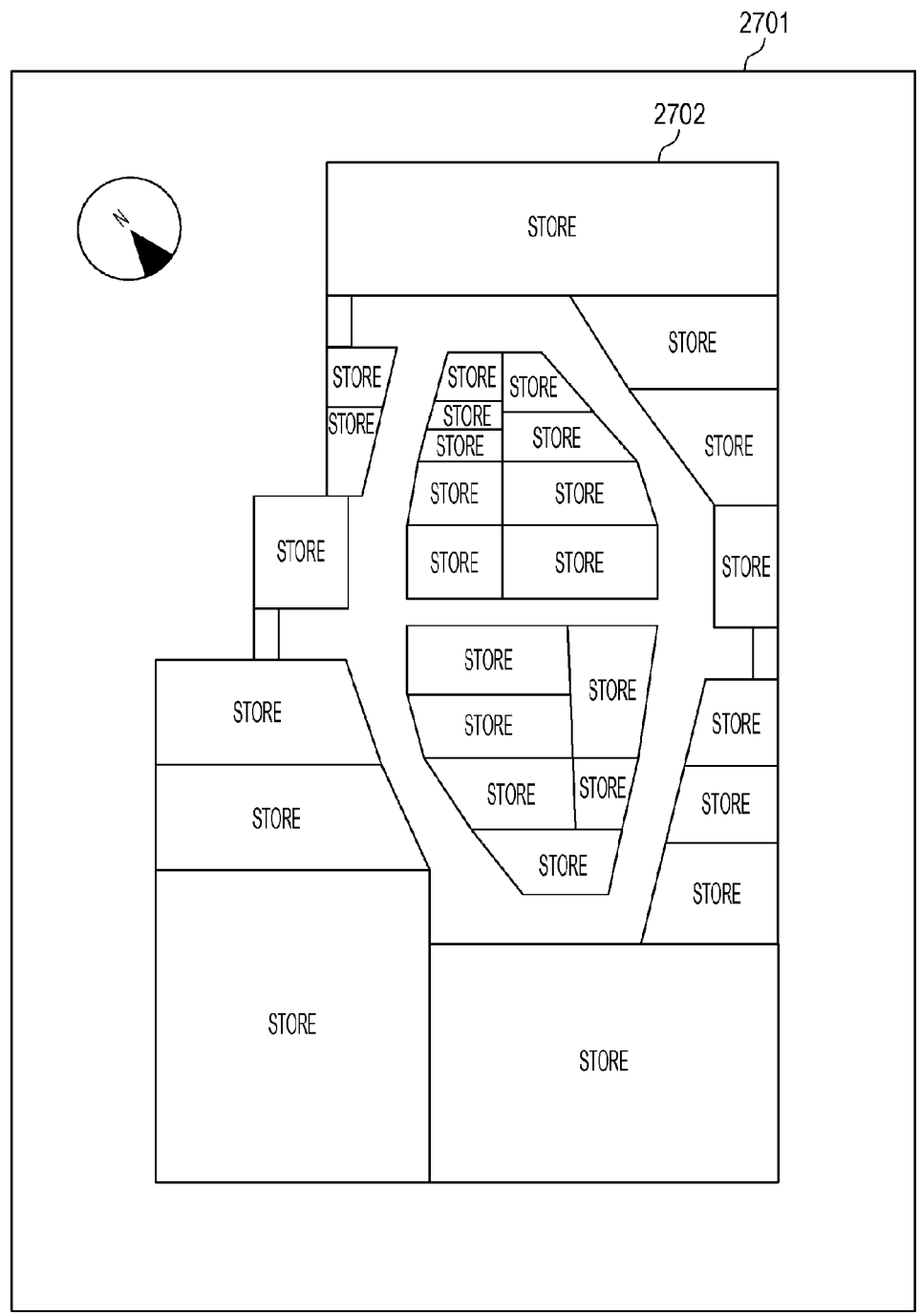
FIG. 27 illustrates a first example of a display screen on which the layout drawing of the commercial facility in FIG. 25 is displayed on the display unit.

FIG. 27 illustrates a first example of a display screen on which the layout drawing of the commercial facility in FIG. 25 is displayed on the display unit 112.

As illustrated in FIG. 27, the display controller 105 rotates the layout drawing through an angle calculated so that an edge 2702, which is one of a plurality of edges in the layout drawing, is made parallel to the upper edge 2701 of the display screen, and displays, on the display unit 112, the layout drawing that has been rotated.

Figure 28:
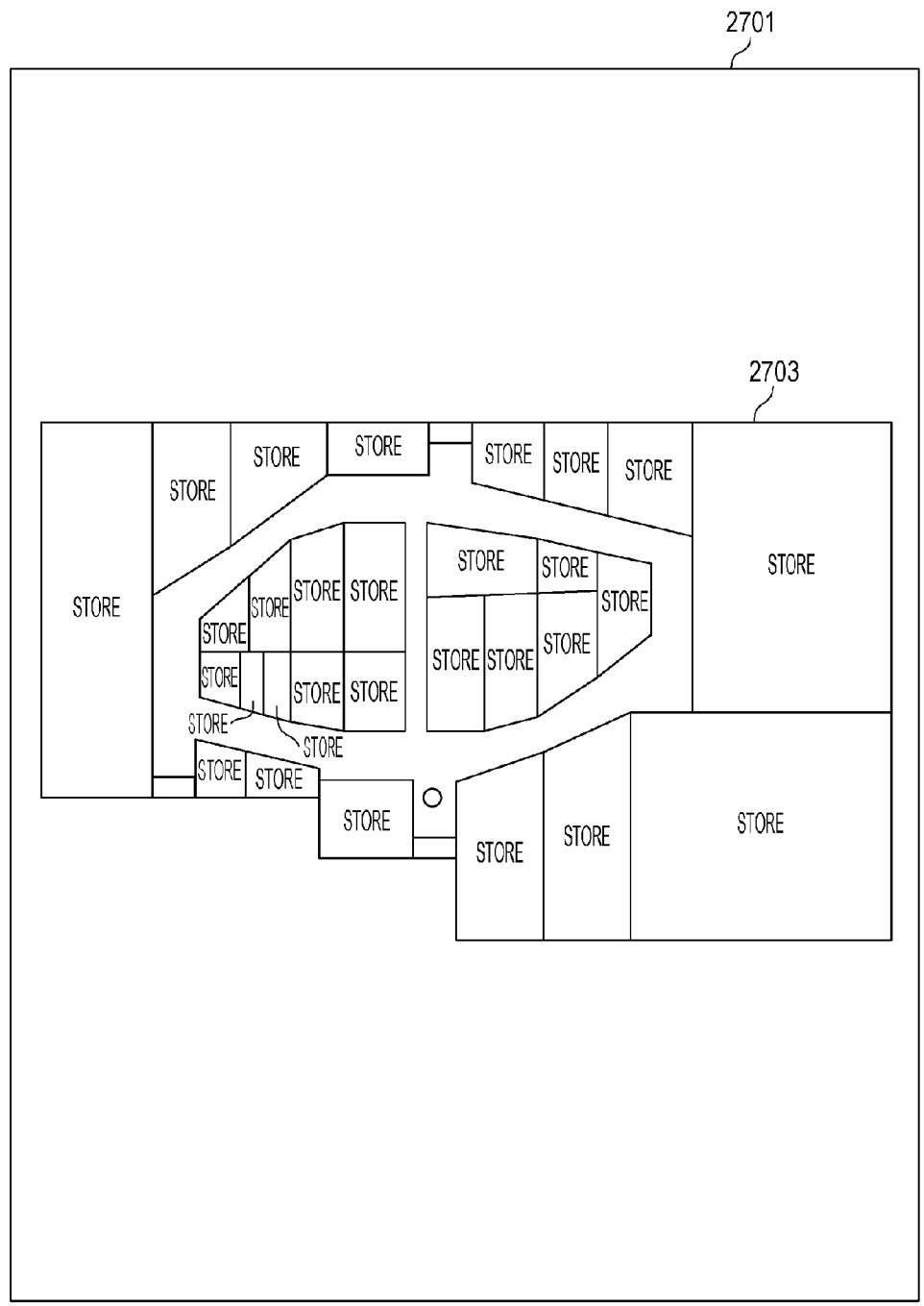
FIG. 28 illustrates a second example of a display screen on which the layout drawing of the commercial facility in FIG. 25 is displayed on the display unit.

FIG. 28 illustrates a second example of a display screen on which the layout drawing of the commercial facility in FIG. 25 is displayed on the display unit 112.

As illustrated in FIG. 28, the display controller 105 rotates the layout drawing through an angle calculated so that an edge 2703, which is one of the plurality of edges in the layout drawing, is made parallel to the upper edge 2701 of the display screen, and displays, on the display unit 112, the layout drawing that has been rotated. The display screen in FIG. 28 is displayed when the orientation of the top of the information processing terminal 101 is changed clockwise through 90 degrees with respect to the display screen in FIG. 27.

Figure 29:
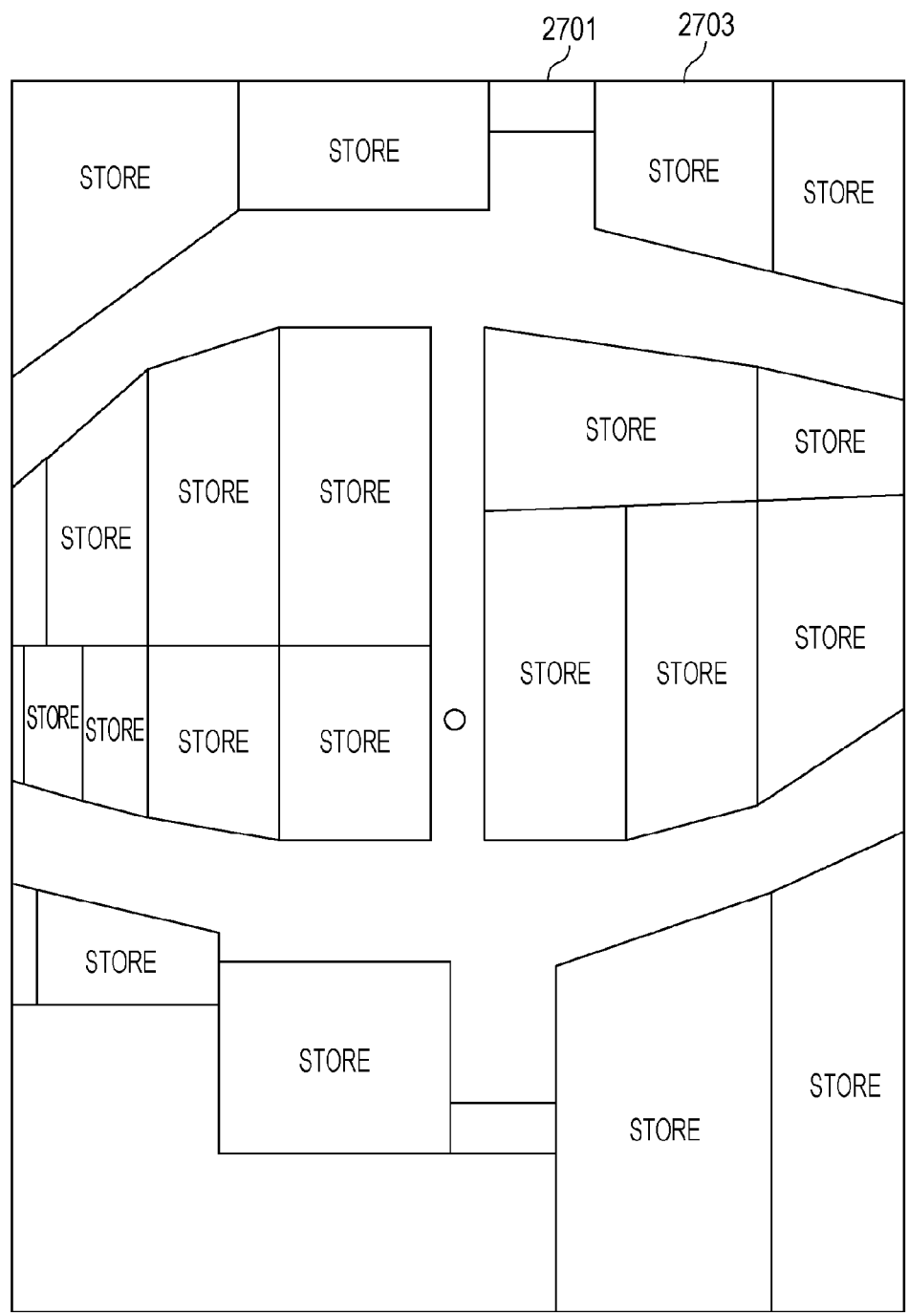
FIG. 29 illustrates a third example of a display screen on which the layout drawing of the commercial facility in FIG. 25 is displayed on the display unit.

FIG. 29 illustrates a third example of a display screen on which the layout drawing of the commercial facility in FIG. 25 is displayed on the display unit 112.

As illustrated in FIG. 29, the display controller 105 rotates the layout drawing through an angle calculated so that the edge 2703, which is one of the plurality of edges in the layout drawing, is made parallel to the upper edge 2701 of the display screen and that the edge 2703 coincides with the upper edge 2701, and displays, on the display unit 112, the layout drawing that has been rotated. The display screen in FIG. 29 is displayed when the orientation of the top of the information processing terminal 101 is changed clockwise through 90 degrees with respect to the display screen in FIG. 27.

Figure 30:
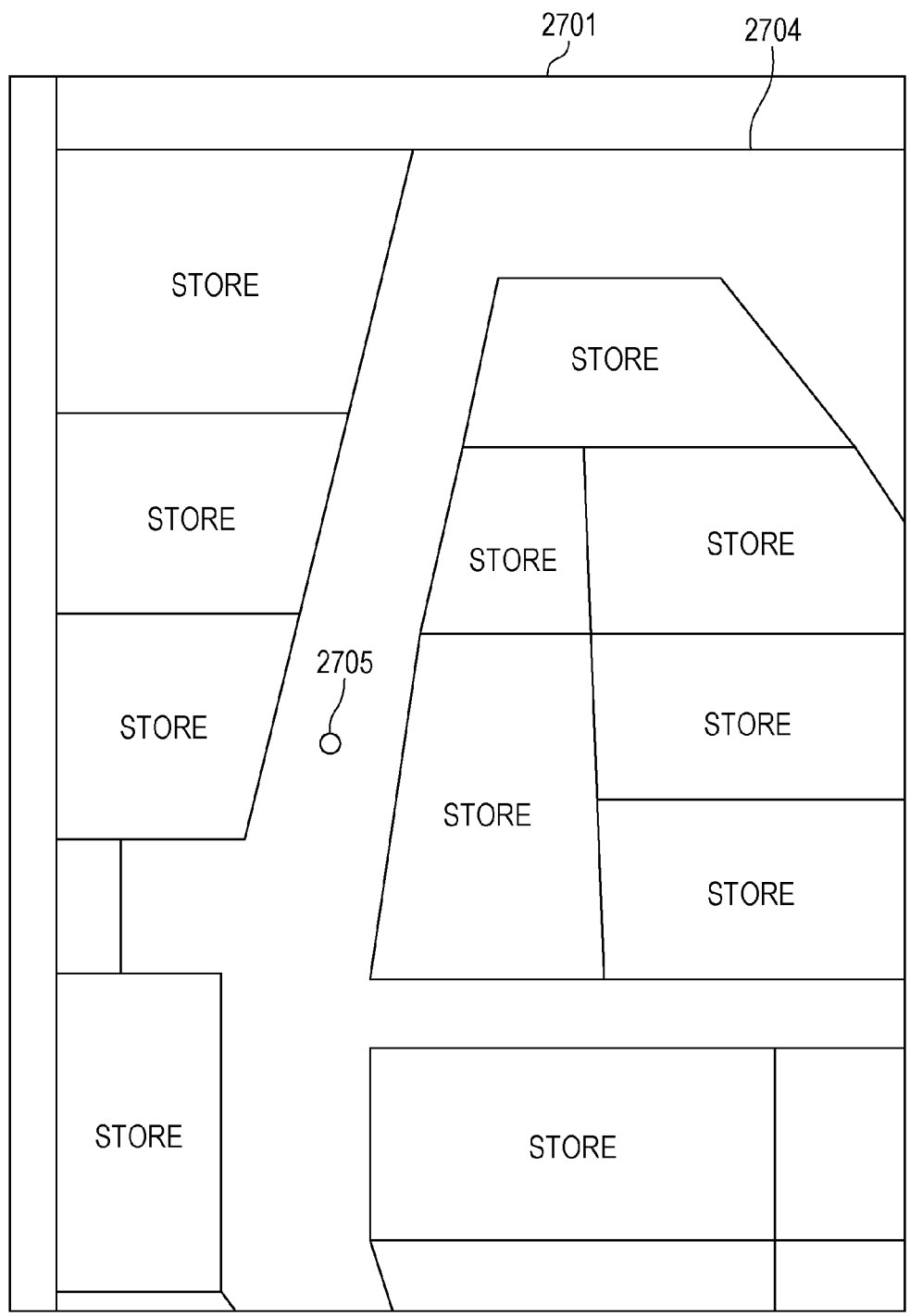
FIG. 30 illustrates a fourth example of a display screen on which the layout drawing of the commercial facility in FIG. 25 is displayed on the display unit.

FIG. 30 illustrates a fourth example of a display screen on which the layout drawing of the commercial facility in FIG. 25 is displayed on the display unit 112.

As illustrated in FIG. 30, the display controller 105 rotates the layout drawing through an angle calculated so that an edge 2704, which is one of the plurality of edges in the layout drawing, is made parallel to the upper edge 2701 of the display screen and that the vicinity of the position 2705 of the information processing terminal 101 is magnified, and displays, on the display unit 112, the layout drawing that has been rotated. The display screen in FIG. 30 is displayed when the orientation of the top of the information processing terminal 101 is changed clockwise through 180 degrees with respect to the display screen in FIG. 27.

According to the embodiments of the present disclosure, which have been described above in detail, it is possible to provide user interfaces through which the user can intuitively locate the intra-building position of a device to be manipulated.

The present disclosure is not limited to these particular embodiments. Many variations and modifications are possible without departing from the intended scope of the present disclosure.

The display control method, display control program, and information processing terminal according to the present disclosure can improve visibility to the user and are useful as a display control method, a display control program, and an information processing terminal that display a layout drawing that indicates the layout of targets on a display screen on a display unit.

What is claimed is:

1. A display control method that displays a computerized floor plan for controlling of target devices displayed on the computerized floor plan on a display screen of an information processing terminal, the method comprising:

detecting, by a sensor, an orientation direction of the information processing terminal, with respect to a layout of a building corresponding to the computerized floor plan;

calculating, by a processor, an angle formed by an edge of a borderline in the computerized floor plan and an edge of the display screen based on the orientation direction of the information processing terminal;

rotating, by the processor, the computerized floor plan based on the angle calculated so that the edge of the borderline in the computerized floor plan is made parallel to the edge of the display screen; and displaying, on the display screen, the computerized floor plan that has been rotated such that the computerized floor plan is displayed parallel with the orientation direction of the information processing terminal.

2. The display control method according to claim 1, further comprising detecting an orientation of a top portion of the information processing terminal for detecting the orientation direction, wherein in the rotating, the computerized floor plan is rotated according to the orientation of the top portion.

3. The display control method according to claim 1, further comprising detecting a position of the information processing terminal, the position being on a map, wherein in the rotating, a decision as to whether to rotate the computerized floor plan is made according to the position detected in the detecting.

4. The display control method according to claim 3, wherein, in the rotating, the position of the information processing terminal is compared with a position of the building corresponding to the computerized floor plan, the position of the building being on the map, to decide whether the information processing terminal is present in building, and if the information processing terminal is decided not to be present in the building, the computerized floor plan is not rotated.

5. The display control method according to claim 1, further comprising:

broadcasting a prescribed wireless signal to a periphery of the information processing terminal; and receiving a reply signal transmitted from a device located in the periphery of the information processing terminal in response to the wireless signal broadcasted, wherein in the rotating, a decision as to whether to rotate the computerized floor plan is made according to the reply signal received in the receiving.

6. The display control method according to claim 5, wherein, in the rotating, a decision is made as to whether the information processing terminal is present in a prescribed area included in the computerized floor plan according to at least one of information, included in the reply signal, that indicates that the device that has transmitted the reply signal, a radio wave intensity of the reply signal, and a travel time from when the wireless signal is broadcasted until the reply signal is received, and if the information processing terminal is decided not to be present in the prescribed area, the computerized floor plan is not rotated.

7. The display control method according to claim 1, wherein, in the calculating, the computerized floor plan is rotated so that an orientation of the edge of the borderline matches any one of north, south, east and west directions on a map, and the angle formed by the edge of the borderline in the computerized floor plan that has been rotated and the edge of the display screen is calculated.

8. The display control method according to claim 7, further comprising:

setting the orientation of the edge of the borderline according to an input received by the information processing terminal, wherein in the setting, the computerized floor plan is configured to be moved, magnified, contracted, or rotated on the display screen and a peripheral map configured to be moved, magnified, contracted, or rotated on the display screen, the peripheral map indicating a periphery of the computerized floor plan, are displayed on the display screen, and if the computerized floor plan and the peripheral map overlap on the display screen as a result of the input, an orientation of the computerized floor plan is set by using orientation information included in the peripheral map.

9. The display control method according to claim 1, wherein:

the edge of the borderline, which is parallel to the edge of the display screen, is a borderline that indicates an exterior wall of the building.

10. The display control method according to claim 1, wherein:

the edge of the borderline, which is parallel to the edge of the display screen, is a borderline that indicates a wall of a room in the building.

11. The display control method according to claim 1, wherein:

the display control method further includes creating a virtual borderline that indicates a virtual wall for a borderline that indicates an exterior wall of the building or for a borderline that indicates a wall of a room in the building; and the edge of the borderline, which is parallel to the edge of the display screen, includes the virtual borderline created in the creating.

12. The display control method according to claim 11, wherein, in the creating, the virtual borderline is created so that the exterior walls or the walls that enclose the room form a convex polygonal shape.

13. The display control method according to claim 11, wherein, in the creating, the virtual borderline is created so that the number of edges of borderlines that indicate the exterior walls or of the borderlines that indicate the walls of the room is reduced by extending the borderline that indicates an exterior wall or the borderline that indicates a wall of the room.

14. The display control method according to claim 11, further comprising accepting a deletion of the virtual borderline created in the creating or an addition of a new virtual borderline according to an input received by the information processing terminal, wherein in the accepting, if borderlines are not closed in the computerized floor plan as a result of the deletion of the borderline or the addition of the new virtual borderline, a user is notified.

15. A non-temporary recording medium in which a display control program is recorded, the display control program displaying a computerized floor plan for controlling of target devices displayed on the computerized floor plan on a display screen of an information processing terminal, wherein the display control program causes a computer in the information processing terminal to detect, using a sensor, an orientation direction of the information processing terminal, with respect to a layout of a building corresponding to the computerized floor plan;

calculate, using a processor, an angle formed by an edge of a borderline in the computerized floor plan and an edge of the display screen based on the orientation direction of the information processing terminal, rotate, using the processor, the computerized floor plan through the angle calculated so that the edge of the borderline in the computerized floor plan is made parallel to the edge of the display screen, and display, on the display screen, the computerized floor plan that has been rotated such that the computerized floor plan is displayed parallel with the orientation direction of the information processing terminal.

16. An information processing terminal that displays a computerized floor plan for controlling of target devices displayed on the computerized floor plan on a display screen, the terminal comprising:
- a sensor that detects an orientation direction of the information processing terminal, with respect to a layout of a building corresponding to the computerized floor plan;
- a display having the display screen; and
- a processor that calculates an angle formed by an edge of a borderline in the computerized floor plan and an edge of the display screen, and
- rotates the computerized floor plan through the angle calculated so that the edge of the borderline in the computerized floor plan is made parallel to the edge of the display screen, wherein
- the display displays the computerized floor plan that has been rotated such that the computerized floor plan is displayed parallel with the orientation direction of the information processing terminal.

* * * * *